US006794729B2

(12) United States Patent
Mori et al.

(10) Patent No.: US 6,794,729 B2
(45) Date of Patent: Sep. 21, 2004

(54) STACKED CAPACITOR AND METHOD OF FORMING THE SAME AS WELL AS SEMICONDUCTOR DEVICE USING THE SAME AND CIRCUIT BOARD USING THE SAME

(75) Inventors: Toru Mori, Tokyo (JP); Takao Yamakazi, Tokyo (JP); Koichiro Nakase, Tokyo (JP)

(73) Assignee: NEC Corporation, Tokyo (JP)

( * ) Notice: Subject to any disclaimer, the term of this patent is extended or adjusted under 35 U.S.C. 154(b) by 98 days.

(21) Appl. No.: 10/085,116

(22) Filed: Mar. 1, 2002

(65) Prior Publication Data

US 2002/0088977 A1 Jul. 11, 2002

(30) Foreign Application Priority Data

Mar. 1, 2001 (JP) .................................. 2001-056950

(51) Int. Cl.[7] .................. H01L 27/108; H01L 29/76; H01L 29/94; H01L 31/119

(52) U.S. Cl. ...................... 257/532; 257/296; 257/295

(58) Field of Search ........................ 257/295–310, 257/532–535; 361/312–315

(56) References Cited

U.S. PATENT DOCUMENTS 6,072,690 A * 6/2000 Farooq et al. ............... 361/312
6,573,584 B1 * 6/2003 Nagakari et al. ............ 257/532

FOREIGN PATENT DOCUMENTS

| JP | 6-283384 | 10/1994 |
|---|---|---|
| JP | 6-314634 | 11/1994 |
| JP | 7-37757 | 2/1995 |
| JP | 7-326536 | 12/1995 |
| JP | 8-17675 | 1/1996 |
| JP | 8-97360 | 4/1996 |
| JP | 11-45822 | 2/1999 |
| JP | 11-97291 | 4/1999 |

* cited by examiner

Primary Examiner—Cuong Nguyen
(74) Attorney, Agent, or Firm—McGinn & Gibb, PLLC

(57) ABSTRACT

A stacked capacitor which comprises: a dielectric layer; a two-dimensional array of terminal electrodes on at least one of first and second surfaces of the dielectric layer; first internal electrodes stacked in multi-levels in the dielectric layer, and the first internal electrodes being electrically connected to a power line second internal electrodes stacked in multi-levels in the dielectric layer, and the second internal electrodes being electrically connected to a ground line; vias in the dielectric layer, so that the terminal electrodes being electrically connected through the vias to the first and second internal electrodes.

18 Claims, 27 Drawing Sheets

—— Example of the present invention
- - - - Comparative example

STACKED CAPACITOR AND METHOD OF FORMING THE SAME AS WELL AS SEMICONDUCTOR DEVICE USING THE SAME AND CIRCUIT BOARD USING THE SAME

BACKGROUND OF THE INVENTION

1. Field of the Invention

The present invention relates to a stacked capacitor, and a method of forming the stacked capacitor as well as a semiconductor device using the stacked capacitor and a circuit board using the stacked capacitor.

2. Description of the Related Art

For allowing the large scale integrated circuit to exhibit a high frequency and high speed performance, it is essential that the clock signal has a high frequency. Such high frequency clock signal, however, causes a voltage drop due to a resistance R and an inductance L of an interconnection between a power supply and the large scale integrated circuit. The voltage drop is represented by the following equation (1).

$$\Delta V = R \times \Delta i + L \times di/dt \quad (1)$$

where $\Delta V$ is the voltage drop, R is the resistance of the interconnection between the power supply and the large scale integrated circuit, L is the inductance of the interconnection between the power supply and the large scale integrated circuit, di/dt is the rate of variation of the load or the quantity of the variation of the load per a unit time.

The above equation means that if R, L and di/dt are large, then the voltage drop $\Delta V$ is large. The clock frequency for the advanced large scale integrated circuit is likely to be extremely high, for example, at least a few hundreds MHz. A rising time "tr" of a pulse waveform in digital circuit is substantially equivalent to a load variation time "dt". If the clock frequency is high, the rising time "tr" is short, whereby the voltage drop $\Delta V$ is large.

It is effective for reducing the voltage drop that a capacitor is connected in parallel to the large scale integrated circuit. This capacitor is generally so called to as decoupling capacitor. If the clock frequency of the large scale integrated circuit is high, this makes it difficult that the power supply temporary compensates the dropped voltage due to the load variation. For this reason, if the clock frequency of the large scale integrated circuit is high, the decoupling capacitor is provided for compensating the dropped voltage due to the load variation.

Assuming that the decoupling capacitor is free of a self-inductance and an internal resistance, it is possible that a charge $Q(=C \times V)$ charged in the decoupling capacitor is supplied to the large scale integrated circuit at the same time when the load variation appears, whereby the voltage variation of the large scale integrated circuit becomes substantially zero.

Actually, however, the self-inductance of the decoupling capacitor is not zero. This means that an LC resonance is caused at an LC-resonant frequency. In the higher frequency range than the LC-resonant frequency, the decoupling capacitor does not work. For this reason, if the clock frequency of the large scale integrated circuit is risen, it is necessary that the LC-resonant frequency "f" of the decoupling capacitor is also risen. The LC-resonant frequency "f" of the decoupling capacitor is represented by the following equation (2).

$$f^2 = 1/(4 \times \pi^2 \times L \times C) \quad (2)$$

It is, therefore, preferable that the capacity C and the inductance L of the decoupling capacitor are small. A stacked ceramic capacitor has often been used as the decoupling capacitor because the stacked ceramic capacitor has a small impedance at a high frequency range and a small capacitance of at most 0.1 micro-F. The stacked ceramic capacitor is smaller in not only equivalent series resistance but also self-inductance than an electrolytic capacitor. For example, the decoupling capacitor for compensating the voltage drop of the large scale integrated circuit may be the stacked ceramic capacitor which has a capacitance C=0.01 micro-F and a self-inductance L=0.4 nH. This capacitor has an LC-resonant frequency "f"=about 80 MHz, which is calculated from the equation: $(2\pi f)2 \times L \times C = 1$.

A conventional technique for reducing the self-inductance L of the capacitor is disclosed in Nikkei Electronics, April, 1999, vol. 19, pp. 144–156. As the thickness of the dielectric layer is thin, then the self-inductance is small. In this view points, thin film capacitors have been used for the semiconductor devices. Japanese laid-open patent publications Nos. 11-45822 and 8-97360.

Japanese laid-open patent publications Nos. 7-326536 and 8-17675 disclose that in order to reduce the self-inductance of a chip type stacked ceramic capacitor, an internal electrode is shaped in such a rectangle that a ratio of a short side "A" to a long side "B" is at most 0.5, and vias are formed over and under the internal electrode, and further substrate electrodes are aligned in a center region of a bottom surface of the chip type stacked ceramic capacitor.

Japanese laid-open patent publications Nos. 7-37757 and 6-314634 disclose a capacitor array for a high density package, wherein a floating capacitance between adjacent two of capacitor units is reduced. Japanese laid-open patent publication No. 6-283384 discloses another capacitor array adjusted for a narrow pitch of the integrated circuit. Japanese laid-open patent publication No. 11-97291 discloses another capacitor array with a reduced electromagnetic interference between adjacent two of the electric function devices.

In recent years, a large current supply to the large scale integrated circuit for exhibiting the high speed performance is needed. Two different large scale integrated circuits are now considered. It is assumed that a first large scale integrated circuit (A) has a switching frequency of 100 MHz, a maximum consumption power of 4V and a power voltage of 3.3V. It is also assumed that a second large scale integrated circuit (B) has a switching frequency of 500 MHz, a maximum consumption power of 18V and a power voltage of 1.8V. The necessary capacitance of the decoupling capacitor for compensation of the voltage drop appearing during a single clock will be calculated. A current rising time "tr" is approximately represented by the following equation (3).

$$tr = \frac{1}{4}f \quad (3)$$

where "f" is the clock frequency.

The necessary capacitances "C" for compensations to the voltage drop of the power voltage to be supplied to the first and second large scale integrated circuits (A) and (B) may be calculated as follows by using the equation: $\Delta Q = C \times \Delta V = I \times tr$. In case of the first large scale integrated circuit (A), the necessary capacitances "C" is $4A \times (0.35/(1 \times 10^8 s))/s)/(3.3V \times 5\%) = 0.085$ micro-F. In case of the second large scale integrated circuit (B), the necessary capacitances "C" is $18A \times (0.35/(0.5 \times 10^9 s))/(1.8V \times 5\%) = 0.14$ micro-F. As the clock frequency for the large scale integrated circuit is high and the consumption power is also large, then the necessary capacitance of the decoupling capacitor is large. If, however, only the capacitance of the decoupling capacitor is increased without increasing the self-inductance, then the LC-resonant frequency "f" is decreased.

Therefore, if the decoupling capacitor for compensation to the load variation of the large scale integrated circuit has a small self-inductance, then this means it easy to obtain a high LC-resonant frequency "f".

In Japanese laid-open patent publications Nos. 11-45822 and 8-97360, it is disclosed that a thin film capacitor has a thin film dielectric film which has a high dielectric constant to obtain a low self-inductance and a large capacity as well as a higher LC-resonant frequency than the normal stacked ceramic capacitor. This thin film capacitor is, however, disadvantageous because of the difficulty of packaging the capacitor onto the board. Also, the process for forming the thin film capacitor is costly process. It is desirable to realize a non-expensive method for forming the thin film capacitor.

In Japanese laid-open patent publications Nos. 7-326536 and 8-17675, the chip-type stacked ceramic capacitor has a low self-inductance. The cost of the process for forming the capacitor is relatively low. The chip-type stacked ceramic capacitor is unsuitable for high density packaging for the narrow pitch of the large scale integrated circuit because of a single alignment of terminal electrodes for electrical connection to a substrate with a limited chip packaging area of 3.2 mm×1.6 mm.

The interconnection between the decoupling capacitor and the large scale integrated circuit has an inductance. In order to reduce the inductance, it is effective to shorten the interconnection between the decoupling capacitor and the large scale integrated circuit. The terminal electrodes for electrical connection to the substrate are provided along a single edge of the bottom surface of the chip-type stacked ceramic capacitor. This structure makes it difficult to further make the distance between the decoupling capacitor and the circuit board shorter than the thickness of the board.

In the above circumstances, the development of a novel stacked capacitor free from the above problems is desirable.

SUMMARY OF THE INVENTION

Accordingly, it is an object of the present invention to provide a novel stacked capacitor free from the above problems.

It is a further object of the present invention to provide a novel stacked capacitor being placed in a peripheral region of a large scale integrated circuit exhibiting a high speed performance, wherein the stacked capacitor serves as a decoupling capacitor for compensating a voltage drop upon variation in load of the large scale integrated circuit, and the stacked capacitor has a high capacity for a unit packaging area.

It is a still further object of the present invention to provide a novel stacked capacitor being placed as an interposer between a circuit board and a large scale integrated circuit exhibiting a high speed performance, wherein the stacked capacitor serves as a decoupling capacitor for compensating a voltage drop upon variation in load of the large scale integrated circuit, and the stacked capacitor has a high capacity for a unit packaging area.

It is yet a further object of the present invention to provide a novel stacked capacitor being placed in a peripheral region of a large scale integrated circuit exhibiting a high speed performance, wherein the stacked capacitor serves as a decoupling capacitor for compensating a voltage drop upon variation in load of the large scale integrated circuit, and the stacked capacitor allows a reduction of a total inductance of the capacitor and a wiring.

It is further more object of the present invention to provide a novel stacked capacitor being placed as an interposer between a circuit board and a large scale integrated circuit exhibiting a high speed performance, wherein the stacked capacitor serves as a decoupling capacitor for compensating a voltage drop upon variation in load of the large scale integrated circuit, and the stacked capacitor allows a reduction of a total inductance of the capacitor and a wiring.

It is more over object of the present invention to provide a novel stacked capacitor being placed as an interposer between a circuit board and a large scale integrated circuit exhibiting a high speed performance, wherein the stacked capacitor reduces a signal transmission delay.

It is still more of the present invention to provide a novel method of forming a stacked capacitor free from the above problems.

It is yet more object of the present invention to provide a novel method of forming a stacked capacitor being placed in a peripheral region of a large scale integrated circuit exhibiting a high speed performance, wherein the stacked capacitor serves as a decoupling capacitor for compensating a voltage drop upon variation in load of the large scale integrated circuit, and the stacked capacitor has a high capacity for a unit packaging area.

It is another object of the present invention to provide a novel method of forming a stacked capacitor being placed as an interposer between a circuit board and a large scale integrated circuit exhibiting a high speed performance, wherein the stacked capacitor serves as a decoupling capacitor for compensating a voltage drop upon variation in load of the large scale integrated circuit, and the stacked capacitor has a high capacity for a unit packaging area.

It is yet another object of the present invention to provide a novel method of forming a stacked capacitor being placed in a peripheral region of a large scale integrated circuit exhibiting a high speed performance, wherein the stacked capacitor serves as a decoupling capacitor for compensating a voltage drop upon variation in load of the large scale integrated circuit, and the stacked capacitor allows a reduction of a total inductance of the capacitor and a wiring.

It is further another object of the present invention to provide a novel method of forming a stacked capacitor being placed as an interposer between a circuit board and a large scale integrated circuit exhibiting a high speed performance, wherein the stacked capacitor serves as a decoupling capacitor for compensating a voltage drop upon variation in load of the large scale integrated circuit, and the stacked capacitor allows a reduction of a total inductance of the capacitor and a wiring.

It is furthermore another object of the present invention to provide a novel method of forming a stacked capacitor being placed as an interposer between a circuit board and a large scale integrated circuit exhibiting a high speed performance, wherein the stacked capacitor reduces a signal transmission delay.

It is an additional object of the present invention to provide a novel semiconductor device including a stacked capacitor free from the above problems.

It is an additional object of the present invention to provide a novel semiconductor device including a stacked capacitor being placed in a peripheral region of a large scale integrated circuit exhibiting a high speed performance, wherein the stacked capacitor serves as a decoupling capacitor for compensating a voltage drop upon variation in load of the large scale integrated circuit, and the stacked capacitor has a high capacity for a unit packaging area.

It is an additional object of the present invention to provide a novel semiconductor device including a stacked capacitor being placed as an interposer between a circuit board and a large scale integrated circuit exhibiting a high speed performance, wherein the stacked capacitor serves as a decoupling capacitor for compensating a voltage drop upon variation in load of the large scale integrated circuit, and the stacked capacitor has a high capacity for a unit packaging area.

It is an additional object of the present invention to provide a novel semiconductor device including a stacked capacitor being placed in a peripheral region of a large scale integrated circuit exhibiting a high speed performance, wherein the stacked capacitor serves as a decoupling capacitor for compensating a voltage drop upon variation in load of the large scale integrated circuit, and the stacked capacitor allows a reduction of a total inductance of the capacitor and a wiring.

It is an additional object of the present invention to provide a novel semiconductor device including a stacked capacitor being placed as an interposer between a circuit board and a large scale integrated circuit exhibiting a high speed performance, wherein the stacked capacitor serves as a decoupling capacitor for compensating a voltage drop upon variation in load of the large scale integrated circuit, and the stacked capacitor allows a reduction of a total inductance of the capacitor and a wiring.

It is an additional object of the present invention to provide a novel semiconductor device including a stacked capacitor being placed as an interposer between a circuit board and a large scale integrated circuit exhibiting a high speed performance, wherein the stacked capacitor reduces a signal transmission delay.

It is an additional object of the present invention to provide a novel circuit board including a stacked capacitor free from the above problems.

It is an additional object of the present invention to provide a novel circuit board including a stacked capacitor being placed in a peripheral region of a large scale integrated circuit exhibiting a high speed performance, wherein the stacked capacitor serves as a decoupling capacitor for compensating a voltage drop upon variation in load of the large scale integrated circuit, and the stacked capacitor has a high capacity for a unit packaging area.

It is an additional object of the present invention to provide a novel circuit board including a stacked capacitor being placed as an interposer between a circuit board and a large scale integrated circuit exhibiting a high speed performance, wherein the stacked capacitor serves as a decoupling capacitor for compensating a voltage drop upon variation in load of the large scale integrated circuit, and the stacked capacitor has a high capacity for a unit packaging area.

It is an additional object of the present invention to provide a novel circuit board including a stacked capacitor being placed in a peripheral region of a large scale integrated circuit exhibiting a high speed performance, wherein the stacked capacitor serves as a decoupling capacitor for compensating a voltage drop upon variation in load of the large scale integrated circuit, and the stacked capacitor allows a reduction of a total inductance of the capacitor and a wiring.

It is an additional object of the present invention to provide a novel circuit board including a stacked capacitor being placed as an interposer between a circuit board and a large scale integrated circuit exhibiting a high speed performance, wherein the stacked capacitor serves as a decoupling capacitor for compensating a voltage drop upon variation in load of the large scale integrated circuit, and the stacked capacitor allows a reduction of a total inductance of the capacitor and a wiring.

It is an additional object of the present invention to provide a novel circuit board including a stacked capacitor being placed as an interposer between a circuit board and a large scale integrated circuit exhibiting a high speed performance, wherein the stacked capacitor reduces a signal transmission delay.

A stacked capacitor which comprises: a dielectric layer; a two-dimensional array of terminal electrodes on at least one of first and second surfaces of the dielectric layer; first internal electrodes stacked in multi-levels in the dielectric layer, and the first internal electrodes being electrically connected to a power line; second internal electrodes stacked in multi-levels in the dielectric layer, and the second internal electrodes being electrically connected to a ground line; vias in the dielectric layer, so that the terminal electrodes being electrically connected through the vias to the first and second internal electrodes.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

Figure 1A:
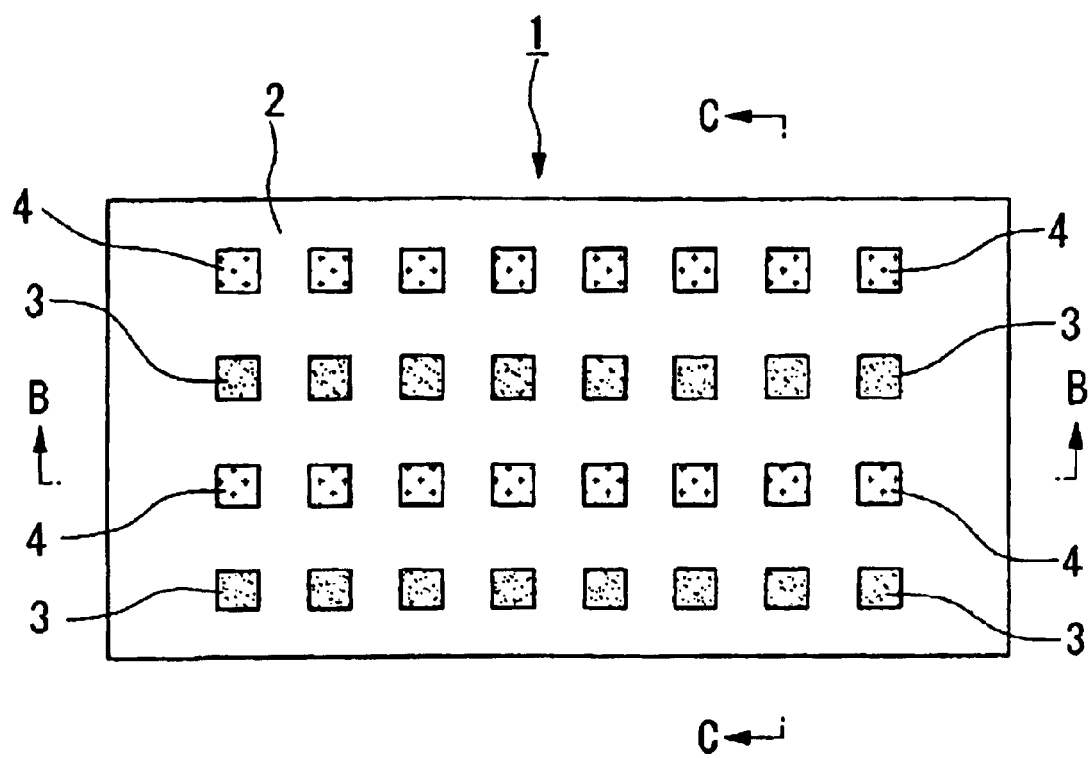
FIG. 1A is a plane view illustrative of a top surface of a novel stacked capacitor in a first embodiment in accordance with the present invention.

The first aspect of the present invention is a stacked capacitor which comprises: a dielectric layer; a two-dimensional array of terminal electrodes on at least one of first and second surfaces of the dielectric layer; first internal electrodes stacked in multi-levels in the dielectric layer, and the first internal electrodes being electrically connected to a power line; second internal electrodes stacked in multi-levels in the dielectric layer, and the second internal electrodes being electrically connected to a ground line; vias in the dielectric layer, so that the terminal electrodes being electrically connected through the vias to the first and second internal electrodes.

It is preferable that the two-dimensional array of terminal electrodes are provided on both the first and second surfaces of the dielectric layer.

It is preferable that the two-dimensional array of terminal electrodes comprises alternating alignments of the terminal electrodes connected to the power line and the terminal electrodes connected to the ground line.

It is preferable that the via connected through the terminal electrode to the power line is electrically isolated from the first and second internal electrodes.

It is preferable to further comprise a low dielectric layer around the via, and the via is separated from the dielectric layer by the low dielectric layer, and the low dielectric layer has a lower dielectric constant than the dielectric layer.

It is preferable that the dielectric constant of the low dielectric layer is at least 40.

It is preferable that the via comprises a metal containing a glass material.

It is preferable that the via comprises a metal containing a metal oxide material.

It is preferable that the dielectric layer comprises a perovskite-structured compound.

A second aspect of the present invention is a semiconductor device comprising: a printed circuit board; a semiconductor integrated circuit; and a stacked capacitor which further comprises: a dielectric layer; a two-dimensional array of terminal electrodes on at least one of first and second surfaces of the dielectric layer; first internal electrodes stacked in multi-levels in the dielectric layer, and the first internal electrodes being electrically connected to a power line; second internal electrodes stacked in multi-levels in the dielectric layer, and the second internal electrodes being electrically connected to a ground line; and vias in the dielectric layer, so that the terminal electrodes being electrically connected through the vias to the first and second internal electrodes.

It is preferable that the stacked capacitor is interposed between the printed circuit board and the semiconductor integrated circuit.

It is preferable that the stacked capacitor is provided on a first surface of the printed circuit board and a second surface of the printed circuit board.

It is preferable that the two-dimensional array of terminal electrodes are provided on both the first and second surfaces of the dielectric layer.

It is preferable that the two-dimensional array of terminal electrodes comprises alternating alignments of the terminal electrodes connected to the power line and the terminal electrodes connected to the ground line.

It is preferable that the via connected through the terminal electrode to the power line is electrically isolated from the first and second internal electrodes.

It is preferable to further comprise a low dielectric layer around the via, and the via is separated from the dielectric layer by the low dielectric layer, and the low dielectric layer has a lower dielectric constant than the dielectric layer.

It is preferable that the dielectric constant of the low dielectric layer is at least 40.

It is preferable that the via comprises a metal containing a glass material.

It is preferable that the via comprises a metal containing a metal oxide material.

It is preferable that the dielectric layer comprises a perovskite-structured compound.

First Embodiment

Figure 1B:
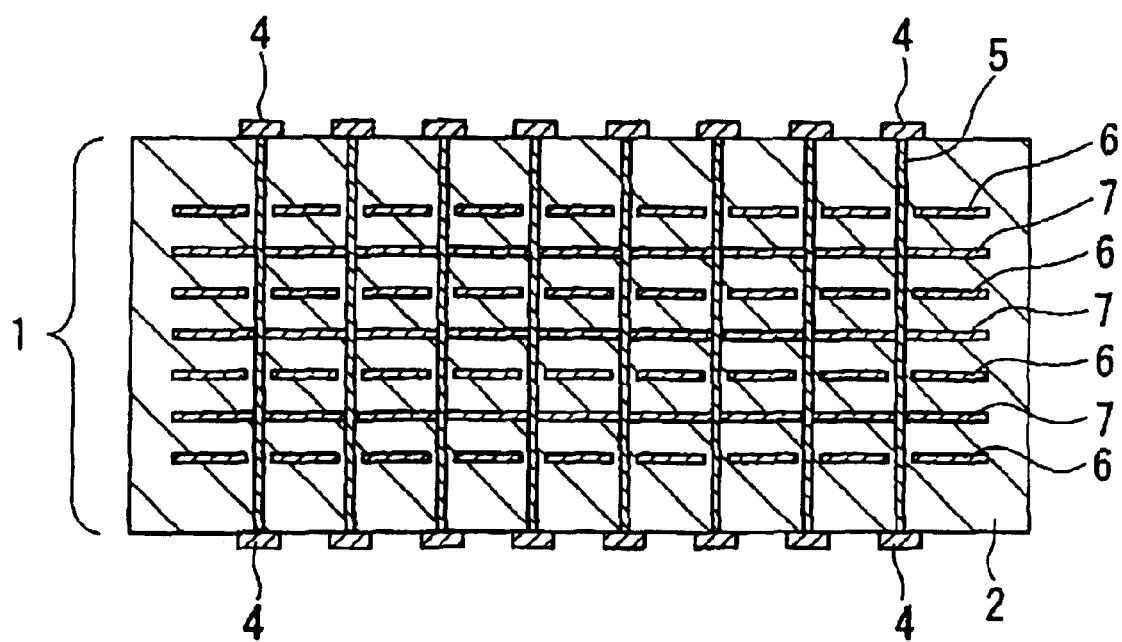
FIG. 1B is a cross sectional elevation view illustrative of the novel stacked capacitor, taken along a B—B line of FIG. 1A.
Figure 1C:
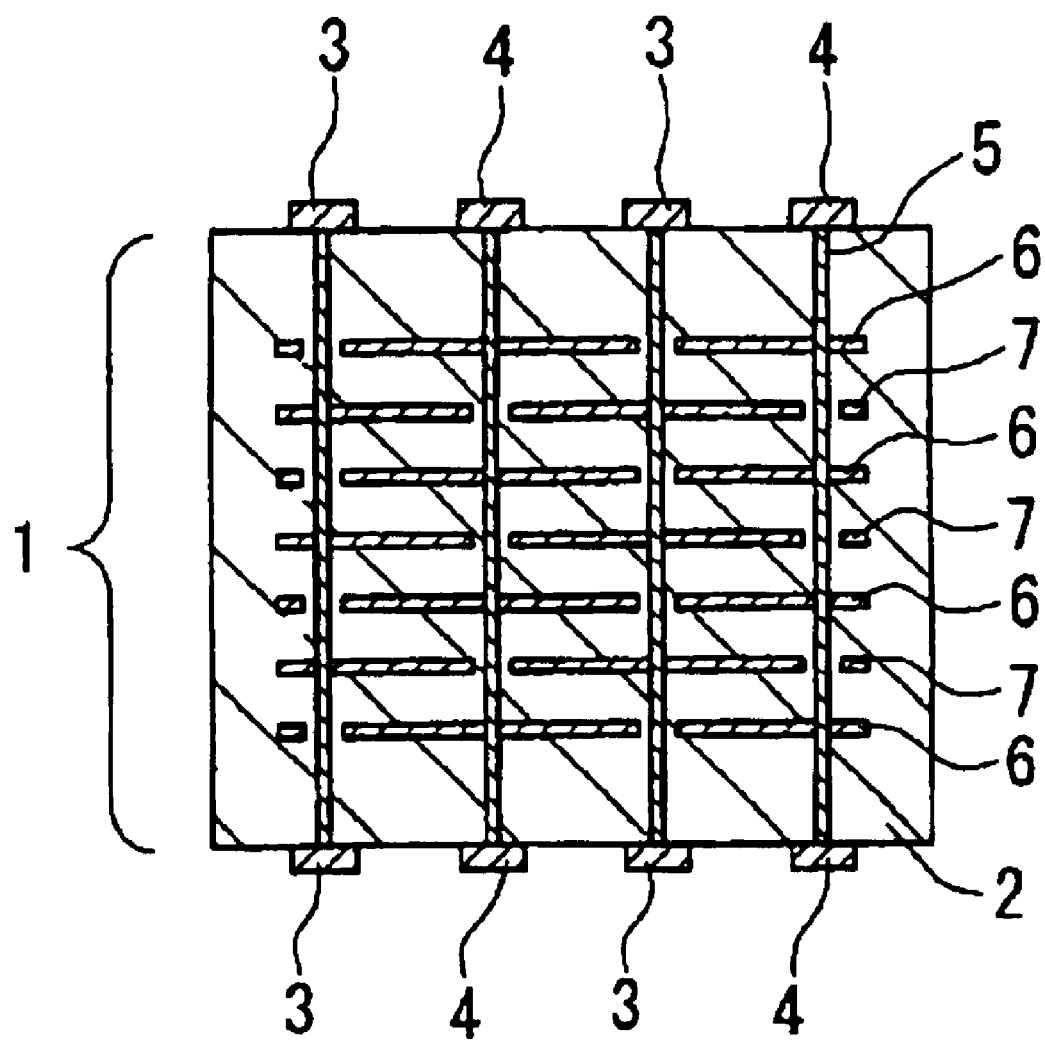
FIG. 1C is a cross sectional elevation view illustrative of the novel stacked capacitor, taken along a C—C line of FIG. 1A.
Figure 1D:
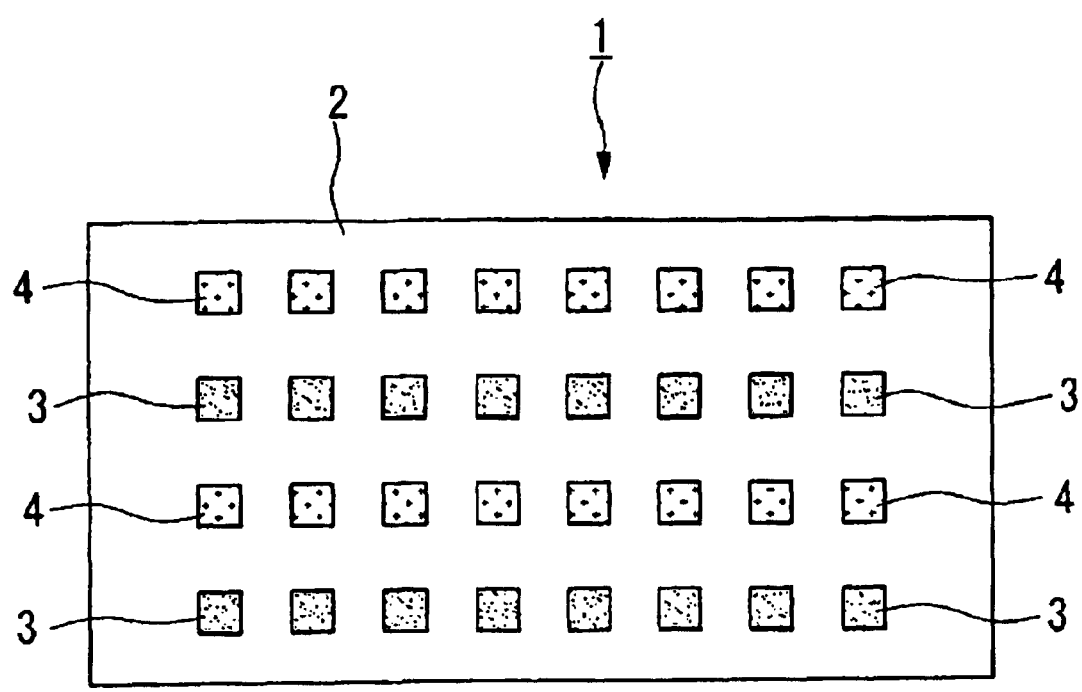
FIG. 1D is a plane view illustrative of a bottom surface of a novel stacked capacitor of FIG. 1A.

A first embodiment according to the present invention will be described in detail with reference to the drawings. FIG. 1A is a plane view illustrative of a top surface of a novel stacked capacitor in a first embodiment in accordance with the present invention. FIG. 1B is a cross sectional elevation view illustrative of the novel stacked capacitor, taken along a B—B line of FIG. 1A. FIG. 1C is a cross sectional elevation view illustrative of the novel stacked capacitor, taken along a C—C line of FIG. 1A. FIG. 1D is a plane view illustrative of a bottom surface of a novel stacked capacitor of FIG. 1A.

A stacked capacitor 1 includes a dielectric layer 1 having a top surface and a bottom surface opposite to the top surface. The stacked capacitor 1 also includes first terminal electrodes 3 and second terminal electrodes 4 which are aligned on each of the top and bottom surfaces of the dielectric layer 2. Two alignments of the first terminal electrodes 3 extend in parallel to a longitudinal direction of the dielectric layer 2. Two alignments of the second terminal electrodes 4 also extend in parallel to the longitudinal direction of the dielectric layer 2. The alignments of the first terminal electrodes 3 and the alignments of the second terminal electrodes 4 are alternately placed in a perpendicular direction to the longitudinal direction.

Positions of the first terminal electrodes 3 on the top surface of the dielectric layer 2 correspond to positions of the first terminal electrodes 3 on the bottom surface of the dielectric layer 2. The first terminal electrodes 3 on the top surface of the dielectric layer 2 are electrically connected through vias 5 to the first terminal electrodes 3 on the bottom surface of the dielectric layer 2. Positions of the second terminal electrodes 4 on the top surface of the dielectric layer 2 correspond to positions of the second terminal electrodes 4 on the bottom surface of the dielectric layer 2. The second terminal electrodes 4 on the top surface of the dielectric layer 2 are electrically connected through vias 5 to the second terminal electrodes 4 on the bottom surface of the dielectric layer 2.

The stacked capacitor 1 also includes first internal electrodes 6 and second internal electrodes 7 which are alternately stacked at multilevels. The multilevels of the first internal electrodes 6 and the multilevels of the second internal electrodes 7 are alternating in the thickness direction of the dielectric layer 2. The first internal electrodes 6 are electrically connected through the vias 5 to the first terminal electrodes 3. The second internal electrodes 7 are electrically connected through the vias 5 to the second terminal electrodes 4.

It is possible to modify the array of the first and second terminal electrodes 3 and 4 optionally in accordance with input/output terminals of the semiconductor package.

Second Embodiment

Figure 2A:
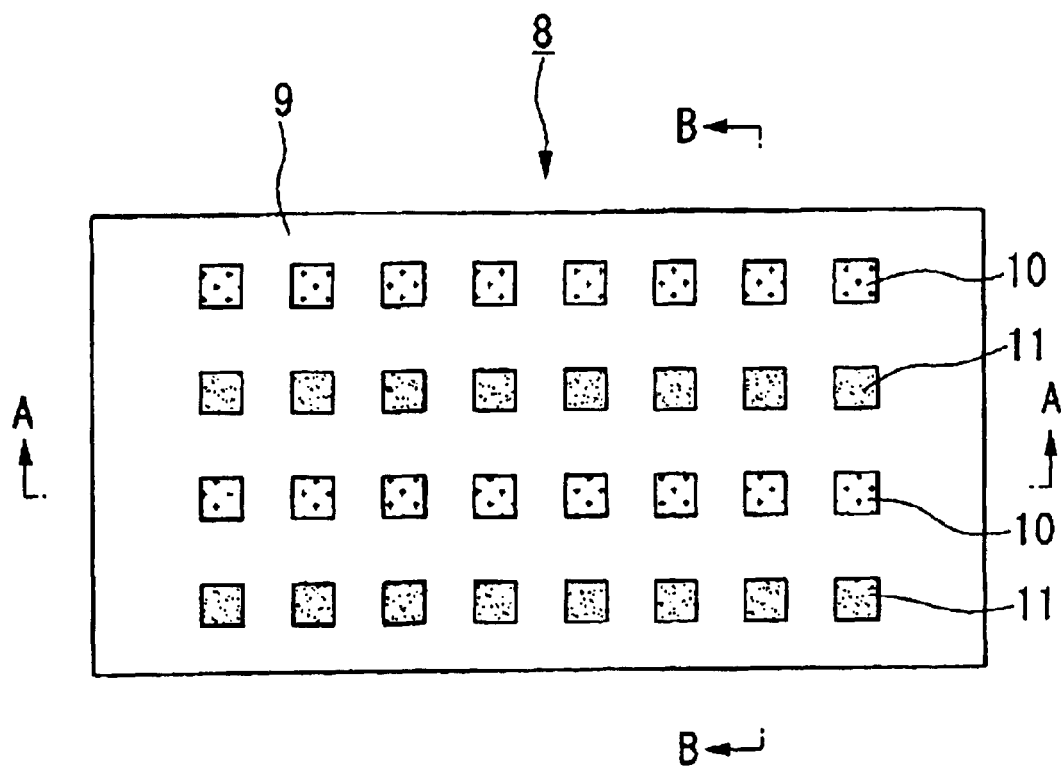
FIG. 2A is a plane view illustrative of a bottom surface of a novel stacked capacitor in a second embodiment in accordance with the present invention.
Figure 2B:
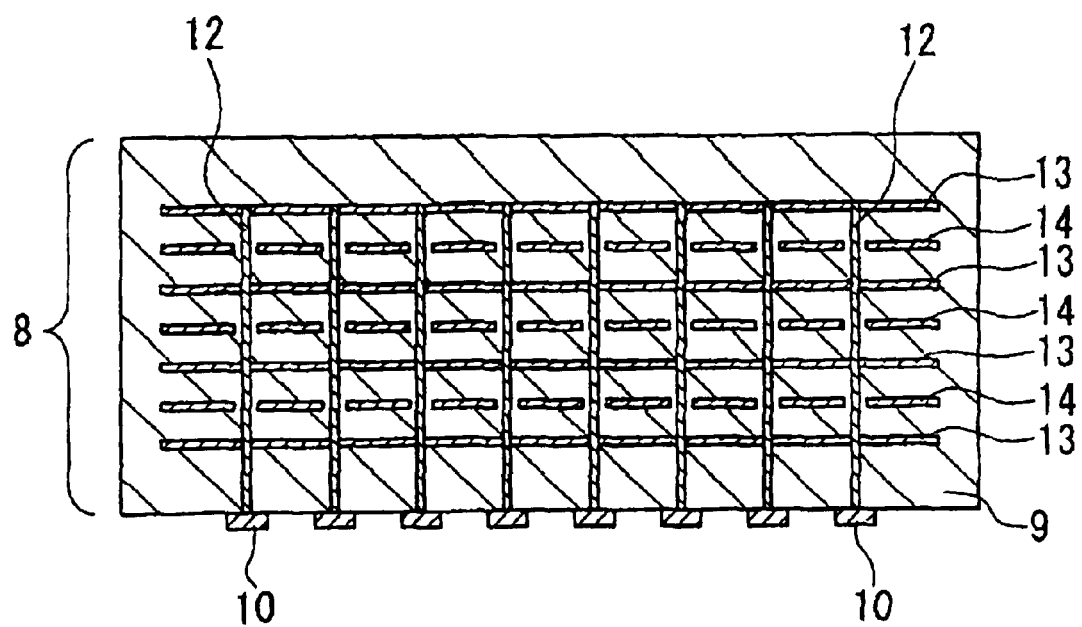
FIG. 2B is a cross sectional elevation view illustrative of the novel stacked capacitor, taken along an A—A line of FIG. 2A.
Figure 2C:
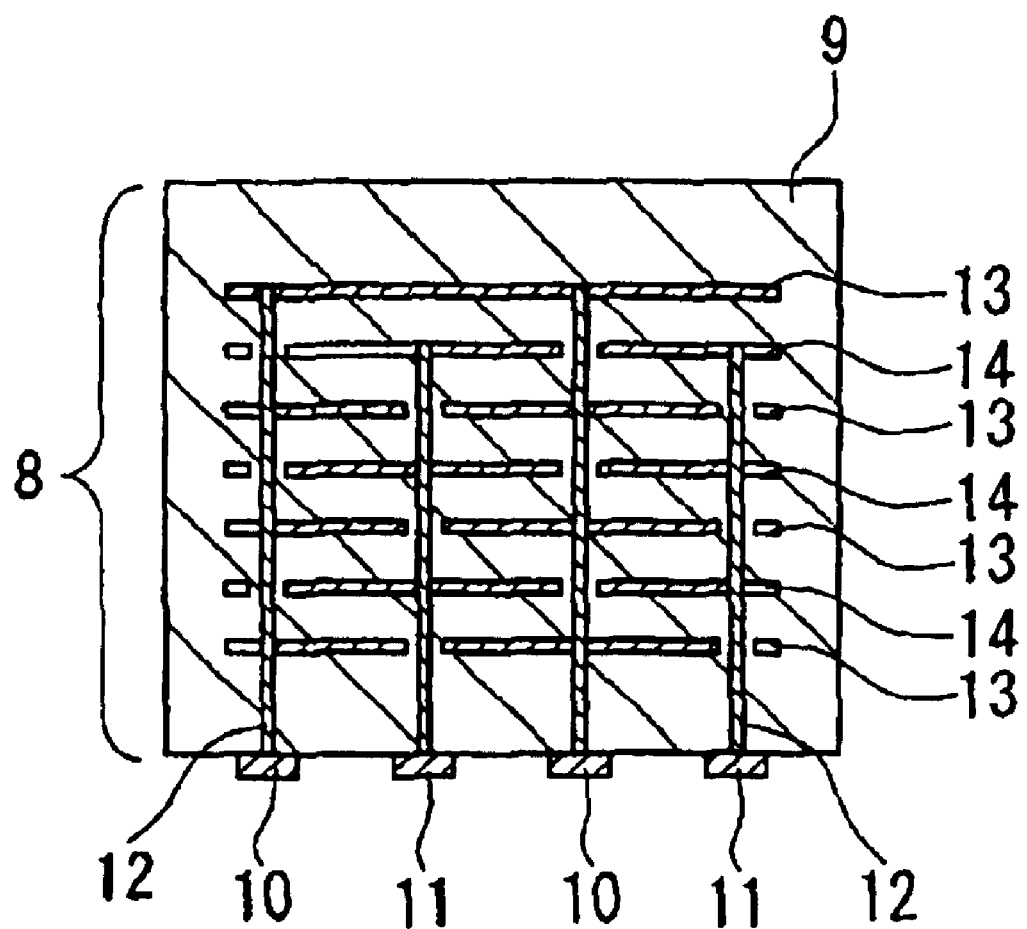
FIG. 2C is a cross sectional elevation view illustrative of the novel stacked capacitor, taken along a B—B line of FIG. 2A.

A second embodiment according to the present invention will be described in detail with reference to the drawings. FIG. 2A is a plane view illustrative of a bottom surface of a novel stacked capacitor in a second embodiment in accordance with the present invention. FIG. 2B is a cross sectional elevation view illustrative of the novel stacked capacitor, taken along an A—A line of FIG. 2A. FIG. 2C is a cross sectional elevation view illustrative of the novel stacked capacitor, taken along a B—B line of FIG. 2A.

A stacked capacitor 8 includes a dielectric layer 9 having a top surface and a bottom surface opposite to the top surface. The stacked capacitor 8 also includes first terminal electrodes 10 and second terminal electrodes 11 which are aligned on only the bottom surface of the dielectric layer 9. Two alignments of the first terminal electrodes 10 extend in parallel to a longitudinal direction of the dielectric layer 9. Two alignments of the second terminal electrodes 11 also extend in parallel to the longitudinal direction of the dielectric layer 9. The alignments of the first terminal electrodes 10 and the alignments of the second terminal electrodes 11 are alternately placed in a perpendicular direction to the longitudinal direction.

The stacked capacitor 1 also includes first internal electrodes 13 and second internal electrodes 14 which are alternately stacked at multilevels. The multilevels of the first internal electrodes 13 and the multilevels of the second internal electrodes 14 are alternating in the thickness direction of the dielectric layer 9. The first internal electrodes 13 are electrically connected through vias 12 to the first terminal electrodes 10. The second internal electrodes 14 are electrically connected through the vias 12 to the second terminal electrodes 11.

It is possible to modify the array of the first and second terminal electrodes 10 and 11 optionally in accordance with input/output terminals of the semiconductor package.

Third Embodiment

Figure 3A:
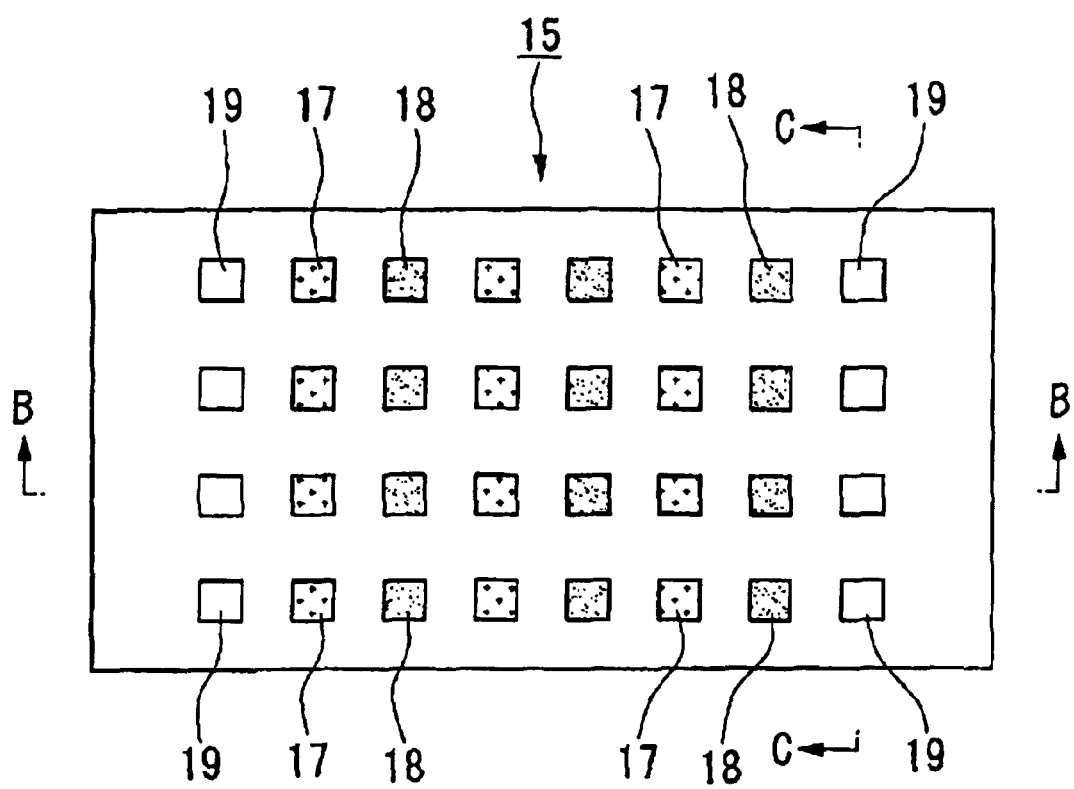
FIG. 3A is a plane view illustrative of a top surface of a novel stacked capacitor in a third embodiment in accordance with the present invention.
Figure 3B:
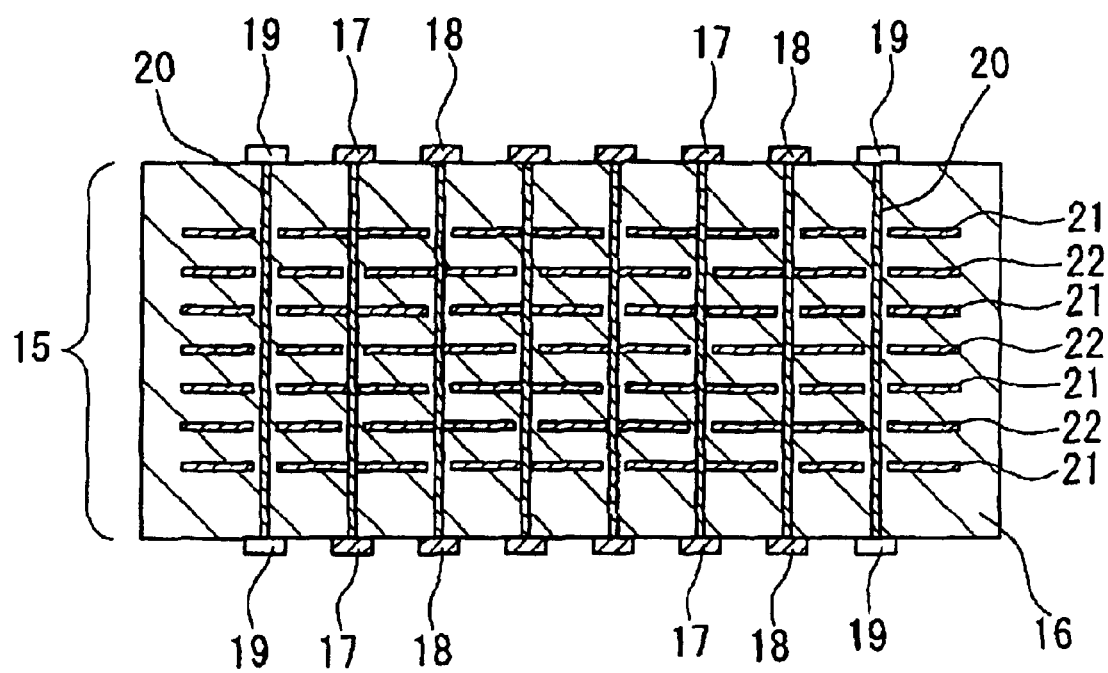
FIG. 3B is a cross sectional elevation view illustrative of the novel stacked capacitor, taken along a B—B line of FIG. 3A.
Figure 3C:
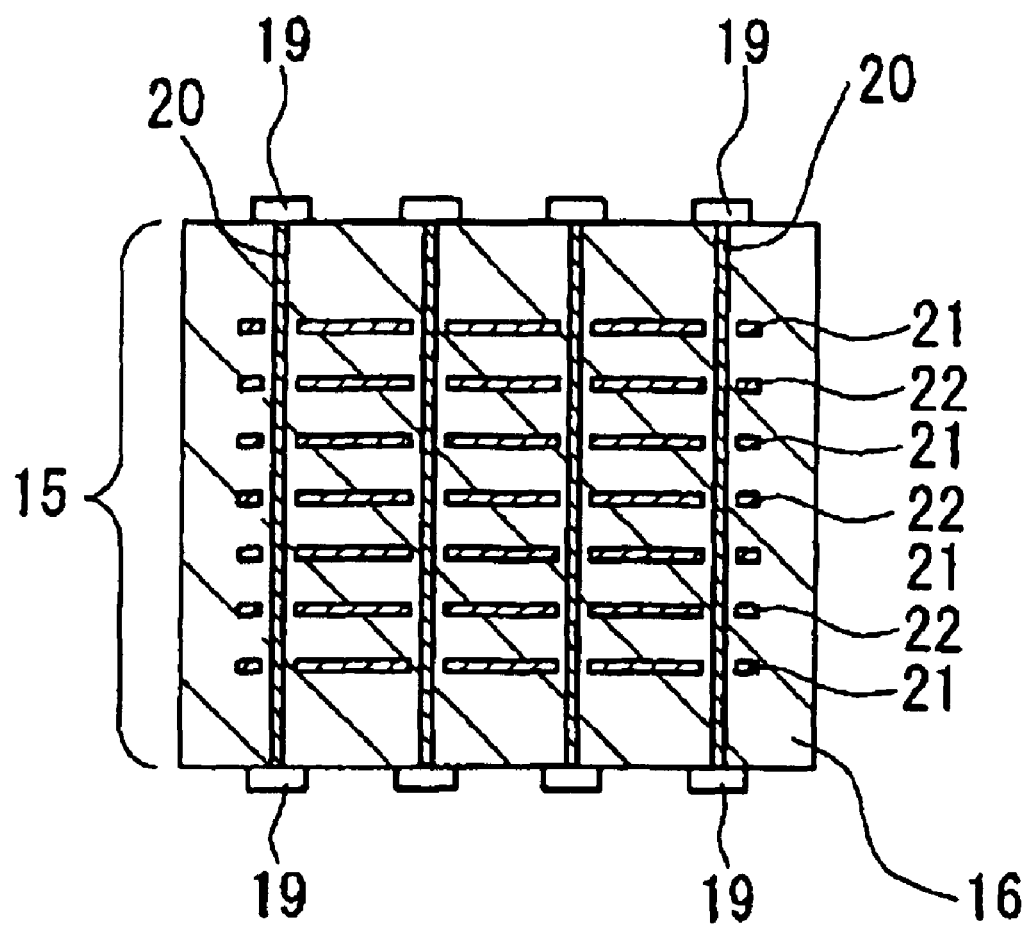
FIG. 3C is a cross sectional elevation view illustrative of the novel stacked capacitor, taken along a C—C line of FIG. 3A.
Figure 3D:
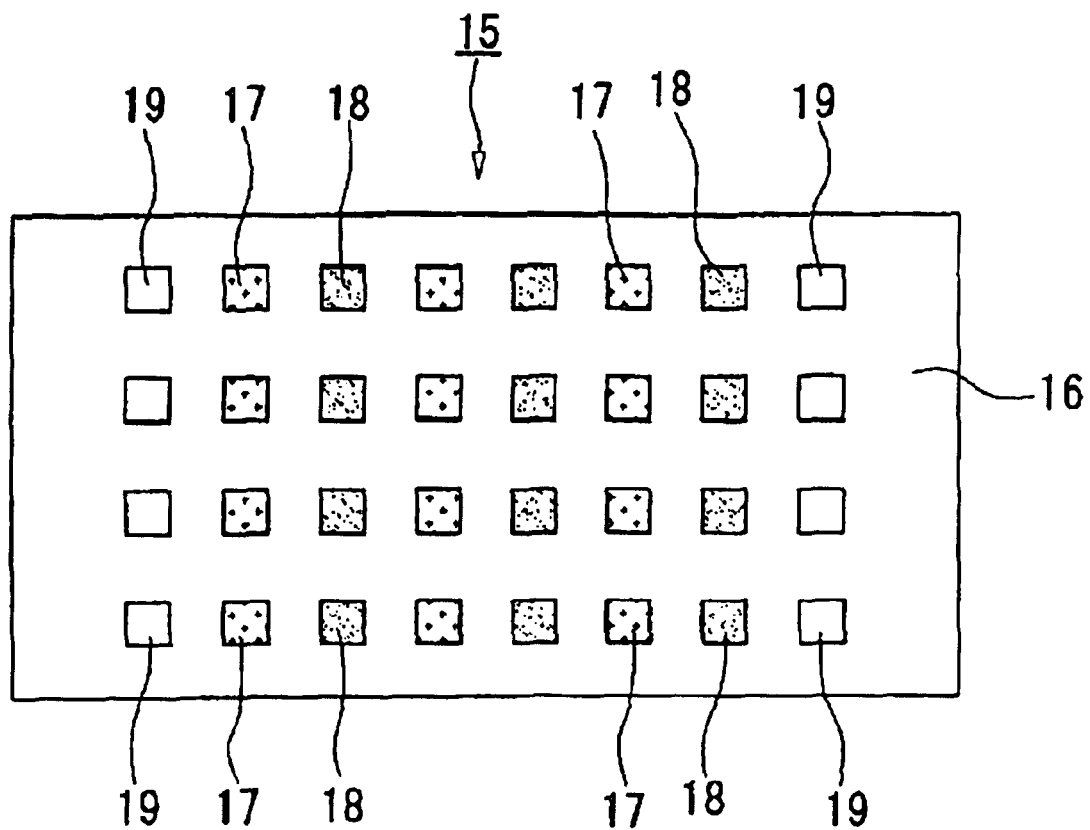
FIG. 3D is a plane view illustrative of a bottom surface of a novel stacked capacitor of FIG. 3A.
Figure 4:
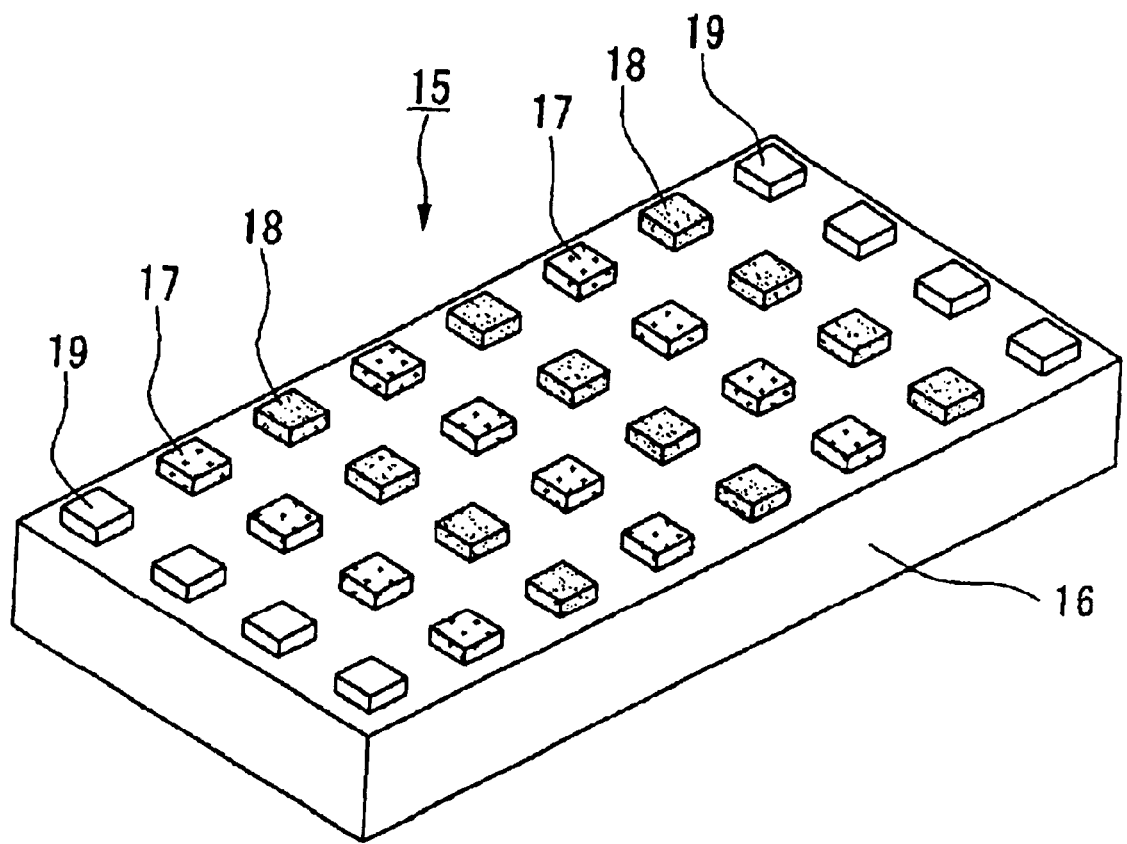
FIG. 4 is a perspective view of the novel stacked capacitor of FIG. 3A.

A third embodiment according to the present invention will be described in detail with reference to the drawings. FIG. 3A is a plane view illustrative of a top surface of a novel stacked capacitor in a third embodiment in accordance with the present invention. FIG. 3B is a cross sectional elevation view illustrative of the novel stacked capacitor, taken along a B—B line of FIG. 3A. FIG. 3C is a cross sectional elevation view illustrative of the novel stacked capacitor, taken along a C—C line of FIG. 3A. FIG. 3D is a plane view illustrative of a bottom surface of a novel stacked capacitor of FIG. 3A. FIG. 4 is a perspective view of the novel stacked capacitor of FIG. 3A.

A stacked capacitor 15 includes a dielectric layer 16 having a top surface and a bottom surface opposite to the top surface. The stacked capacitor 15 also includes first terminal electrodes 17, second terminal electrodes 18 and third terminal electrodes 19 which are aligned on each of the top and bottom surfaces of the dielectric layer 16. Three alignments of the first terminal electrodes 17 extend in parallel to a perpendicular direction to a longitudinal direction of the dielectric layer 16. Three alignments of the second terminal electrodes 18 also extend in parallel to the perpendicular direction to the longitudinal direction of the dielectric layer 16. The alignments of the first terminal electrodes 17 and the alignments of the second terminal electrodes 18 are alternately placed in the longitudinal direction. Further, two alignments of the third terminal electrodes 19 are placed most outside of the array of the first and second terminal electrodes 17 and 18. The two alignments of the third terminal electrodes 19 extend in the perpendicular direction to the longitudinal direction of the dielectric layer 16.

Positions of the first terminal electrodes 17 on the top surface of the dielectric layer 16 correspond to positions of the first terminal electrodes 17 on the bottom surface of the dielectric layer 16. The first terminal electrodes 17 on the top surface of the dielectric layer 16 are electrically connected through vias 20 to the first terminal electrodes 17 on the bottom surface of the dielectric layer 16. Positions of the second terminal electrodes 18 on the top surface of the dielectric layer 16 correspond to positions of the second terminal electrodes 18 on the bottom surface of the dielectric layer 16. The second terminal electrodes 18 on the top surface of the dielectric layer 16 are electrically connected through vias 20 to the second terminal electrodes 18 on the bottom surface of the dielectric layer 16. Positions of the third terminal electrodes 19 on the top surface of the dielectric layer 16 correspond to positions of the third terminal electrodes 19 on the bottom surface of the dielectric layer 16. The third terminal electrodes 19 on the top surface of the dielectric layer 16 are electrically connected through vias 20 to the third terminal electrodes 19 on the bottom surface of the dielectric layer 16.

The stacked capacitor 15 also includes first internal electrodes 21 and second internal electrodes 22 which are alternately stacked at multilevels. The multilevels of the first internal electrodes 21 and the multilevels of the second internal electrodes 22 are alternating in the thickness direction of the dielectric layer 16. The first internal electrodes 21 are electrically connected through the vias 20 to the first terminal electrodes 17. The second internal electrodes 22 are electrically connected through the vias 20 to the second terminal electrodes 18. Ether the first internal electrodes 21 or the second internal electrodes 22 are not electrically connected through the vias 20 to the third terminal electrodes 19.

It is possible to modify the array of the first, second and third terminal electrodes 17, 18 and 19 optionally in accordance with input/output terminals of the semiconductor package.

Fourth Embodiment

Figure 5:
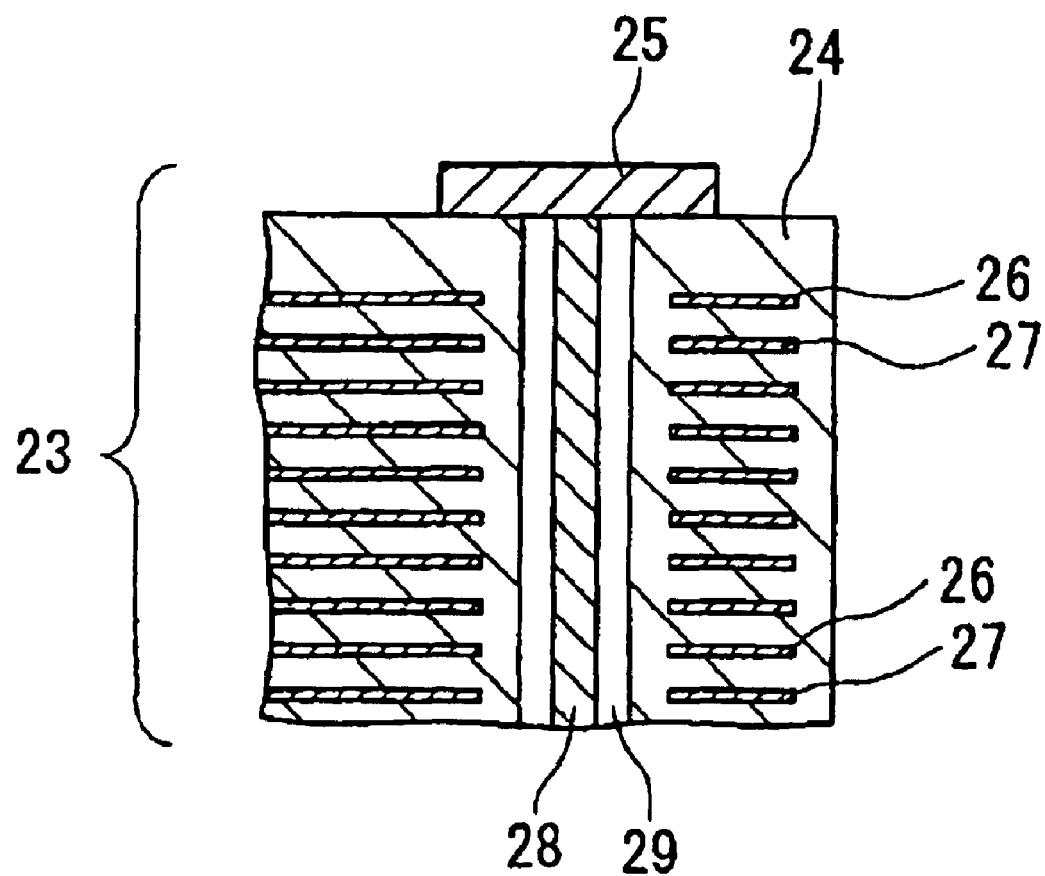
FIG. 5 is a fragmentary cross sectional elevation view of a novel stacked capacitor in a fourth embodiment in accordance with the present invention.

A fourth embodiment according to the present invention will be described in detail with reference to the drawings. FIG. 5 is a fragmentary cross sectional elevation view of a novel stacked capacitor in a fourth embodiment in accordance with the present invention. A stacked capacitor 23 includes a dielectric layer 24 having a top surface and a bottom surface opposite to the top surface. The stacked capacitor 23 also includes third terminal electrodes 25 on the top surface of the dielectric layer 24. The stacked capacitor 23 also includes first internal electrodes 26 and second internal electrodes 27 which are alternately stacked in the dielectric layer 24. The third terminal electrode 25 is connected to a via 28 which is isolated by a gap 29 from the dielectric layer 24. Either the first internal electrodes 26 or the second internal electrodes 27 are not electrically connected through the via 28 to the third terminal electrode 25. The gap 29 has a low dielectric constant for avoiding a signal transmission delay.

Fifth Embodiment

Figure 6:
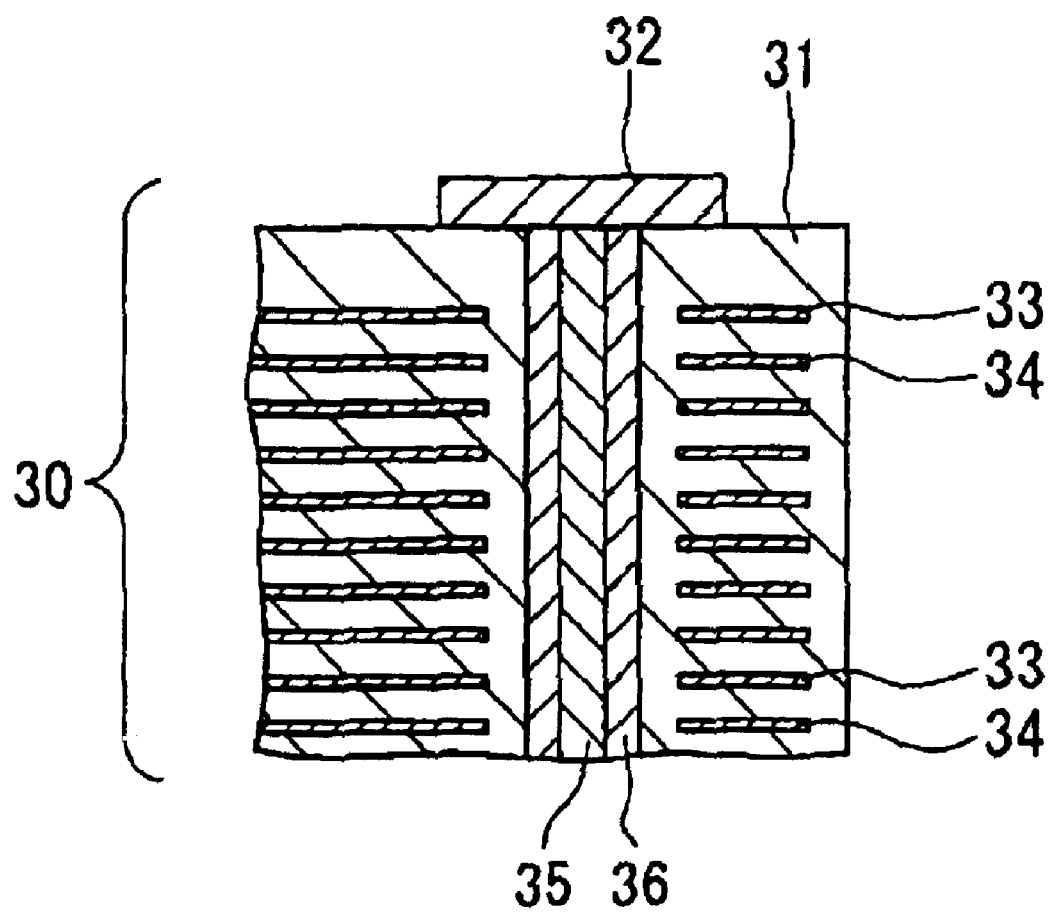
FIG. 6 is a fragmentary cross sectional elevation view of a novel stacked capacitor in a fifth embodiment in accordance with the present invention.

A fifth embodiment according to the present invention will be described in detail with reference to the drawings. FIG. 6 is a fragmentary cross sectional elevation view of a novel stacked capacitor in a fifth embodiment in accordance with the present invention. A stacked capacitor 30 includes a dielectric layer 31 having a top surface and a bottom surface opposite to the top surface. The stacked capacitor 30 also includes third terminal electrodes 32 on the top surface of the dielectric layer 31. The stacked capacitor 30 also includes first internal electrodes 33 and second internal electrodes 34 which are alternately stacked in the dielectric layer 31. The third terminal electrode 32 is connected to a via 35 which is isolated by a low dielectric layer 36 from the dielectric layer 31. Either the first internal electrodes 33 or the second internal electrodes 34 are not electrically connected through the via 35 to the third terminal electrode 32. The low dielectric layer 36 has a lower dielectric constant than the dielectric layer 31 for avoiding a signal transmission delay. The low dielectric layer 36 has a dielectric constant of at most 40. The low dielectric layer 36 may comprise an organic material or an inorganic material which has the dielectric constant of at most 40.

Six Embodiment

Figure 7:
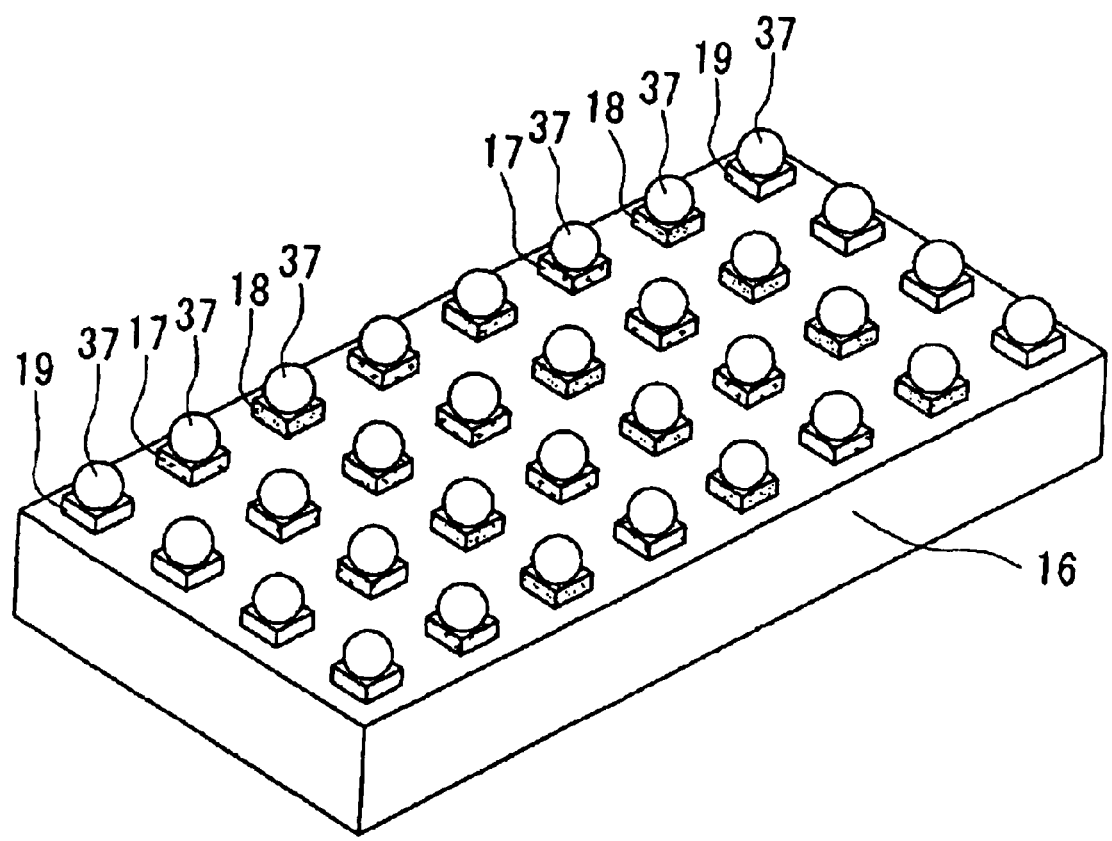
FIG. 7 is a perspective view of the novel stacked capacitor of FIG. 6.

A sixth embodiment according to the present invention will be described in detail with reference to the drawings. FIG. 7 is a perspective view of the novel stacked capacitor of FIG. 6. A stacked capacitor 16 has the bottom surface which is provided thereon with the matrix array of the first, second and third terminal electrodes 17, 18 and 19, on which solder bumps 37 are provided for the flip-chip bonding.

Seventh Embodiment

A seventh embodiment according to the present invention will be described. The dielectric layer 2, 9, 16, 24, or 31 comprises a perovskite-structured compound.

Eighth Embodiment

Figure 8:
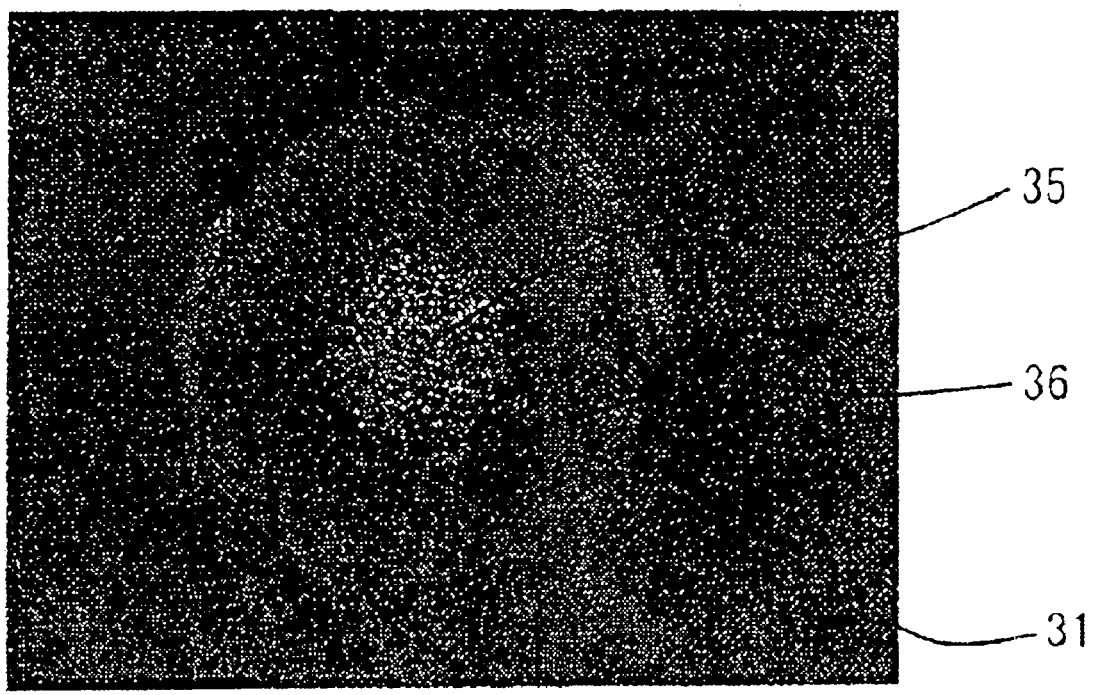
FIG. 8 is an optical microscope photograph of the low dielectric layer interposed between the dielectric layer and the via in the eighth embodiment in accordance with the present invention.

An eighth embodiment according to the present invention will be described. A method of forming a stacked capacitor is provided. Via electrodes are formed as follows. An electrode paste is used which contains a glass material by at least 0.05 wt % and more preferably in the range of 0.1 wt %–5 wt %. The glass-containing electrode paste is sintered at a temperature of at least 900° C. to react the dielectric layer 31 with the glass thereby forming the low dielectric layer 36 interposed between the dielectric layer 31 and the via 35 as shown in FIG. 6. FIG. 8 is an optical microscope photograph of the low dielectric layer interposed between the dielectric layer and the via in the eighth embodiment in accordance with the present invention. The via 35 has a diameter of 0.2 mm. In the sintering process, the glass component in the electrode paste is diffused outwardly, so that the reaction of the glass and the dielectric material is caused on the boundary between the via 35 and the dielectric layer 31, whereby the perovskite-structure is broken, and the low dielectric layer 36 is formed.

Ninth Embodiment

A ninth embodiment according to the present invention will be described. A method of forming a stacked capacitor is provided. Via electrodes are formed as follows. An electrode paste is used which contains a metal oxide material by at least 0.05 wt % and more preferably in the range of 0.1 wt %–5 wt %. The metal oxide material-containing electrode paste is sintered at a temperature of at least 900° C. to react the dielectric layer 31 with the metal oxide material thereby forming the low dielectric layer 36 interposed between the dielectric layer 31 and the via 35 as shown in FIG. 6. In the sintering process, the metal oxide material in the electrode paste is diffused outwardly, so that the reaction of the metal oxide material and the dielectric material is caused on the boundary between the via 35 and the dielectric layer 31, whereby the perovskite-structure is broken, and the low dielectric layer 36 is formed. As the metal oxide material, aluminum oxide, zirconium oxide, titanium oxide and niobium oxide are, for example, available.

Tenth Embodiment

Figure 9A:
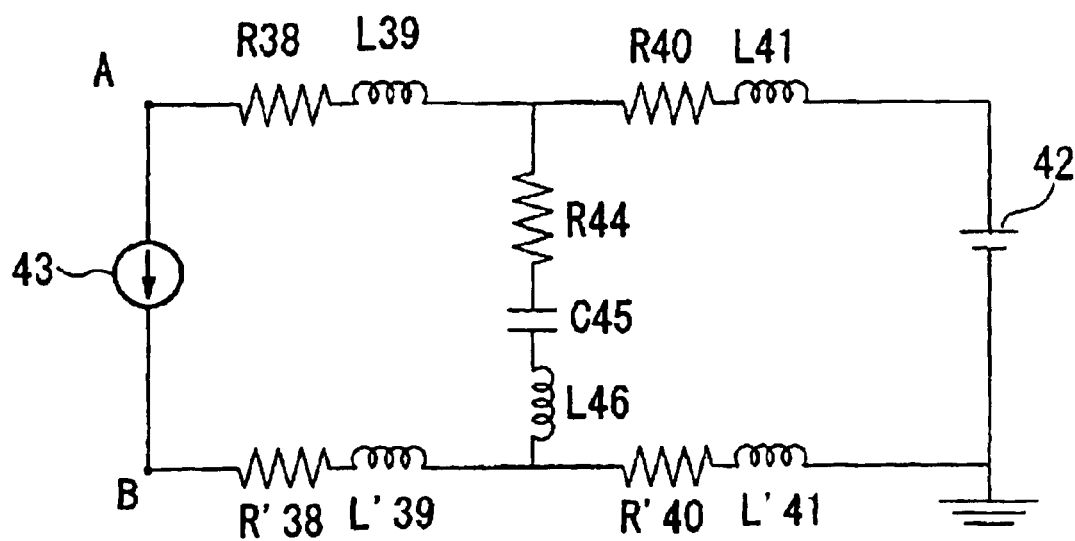
FIG. 9A is a circuit diagram illustrative of an equivalent circuit diagram of the circuit board including the stacked capacitor.

A tenth embodiment according to the present invention will be described with reference to the drawings. FIG. 9A is a circuit diagram illustrative of an equivalent circuit diagram of the circuit board including the stacked capacitor. The circuit board includes a power source 42, a large scale integrated circuit 43, a first series connection of a resistance R38, an inductance L39, a resistance R40 and an inductance LA1 between the power source 42 and the large scale integrated circuit 43, and a second series connection of a resistance R'38, an inductance L'39, a resistance R'40 and an inductance L'41 between the power source 42 and the large scale integrated circuit 43. A stacked capacitor is connected in parallel to the power source 42 and the large scale integrated circuit 43. The stacked capacitor is substantially equivalent to a series connection of a resistance R44, a capacitance C45 and an inductance L46. It is preferable to reduce the inductances L39 and L'39 between the large scale integrated circuit 43 and the stacked capacitor comprising the series connection of the resistance R44, the capacitance C45 and the inductance L46.

Eleventh Embodiment

Figure 10:
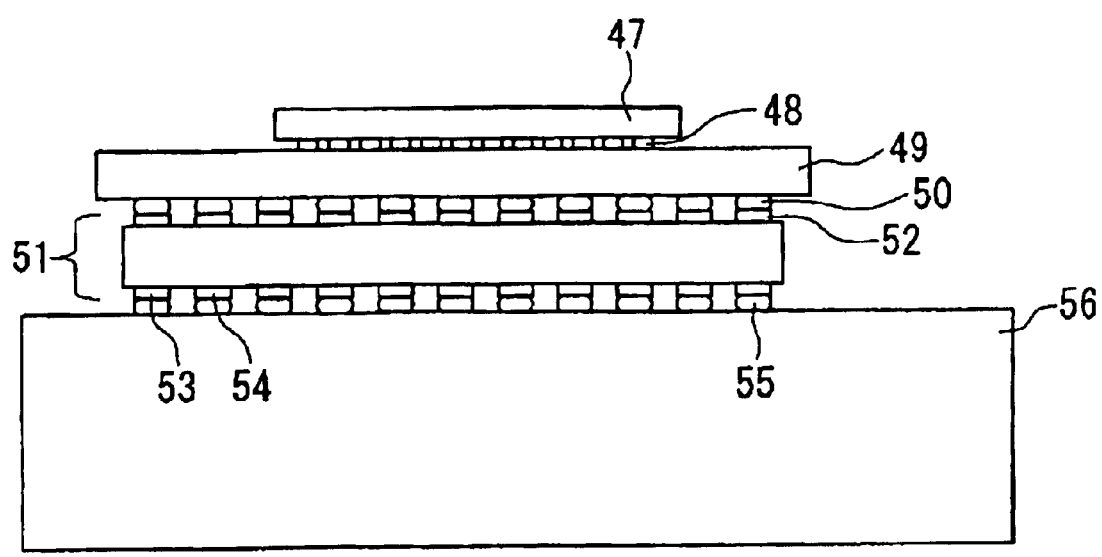
FIG. 10 is a cross sectional elevation view of a semiconductor device over a circuit board in an eleventh embodiment according to the present invention.

An eleventh embodiment according to the present invention will be described with reference to the drawings. FIG. 10 is a cross sectional elevation view of a semiconductor device over a circuit board in an eleventh embodiment according to the present invention. A stacked capacitor 51 is provided over a printed circuit board 56. A CSP 49 is also provided over the stacked capacitor 51. A bare chip 47 is also mounted through solder bumps over the CSP 49. The CSP 49 is electrically connected to the stacked capacitor 51 through solder bumps 50 and terminal electrodes 52. The stacked capacitor 51 is also electrically connected to the printed circuit board 56 through solder bumps 55 and terminal electrodes 53 and 54. The terminal electrodes 52 are connected to signal lines of the large scale integrated circuit. The terminal electrodes 53 are connected to power lines. The terminal electrodes 54 are connected to ground lines.

Twelfth Embodiment

Figure 11:
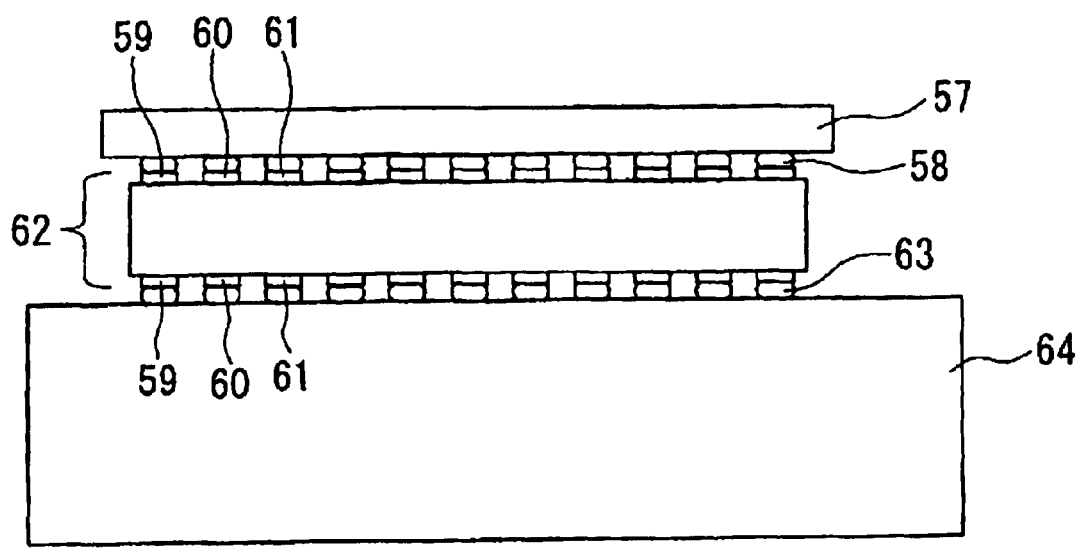
FIG. 11 is a cross sectional elevation view of a semiconductor device over a circuit board in a twelfth embodiment according to the present invention.

A twelfth embodiment according to the present invention will be described with reference to the drawings. FIG. 11 is a cross sectional elevation view of a semiconductor device over a circuit board in a twelfth embodiment according to the present invention. A stacked capacitor 62 is provided as an interposer between a printed circuit board 64 and a large scale integrated circuit bare chip 57. The stacked capacitor 62 is electrically connected to the large scale integrated circuit bare chip 57 through first, second and third terminal electrodes 59, 60, and 61 and solder bumps 58. The stacked capacitor 62 is also electrically connected to the printed circuit board 64 through the first, second and third terminal electrodes 59, 60, and 61 and the solder bumps 58. The first terminal electrode 59 is connected to the signal line of the large scale integrated circuit. The second terminal electrode 60 is connected to the power line. The third terminal electrode 61 is connected to the ground line.

Thirteenth Embodiment

Figure 12:
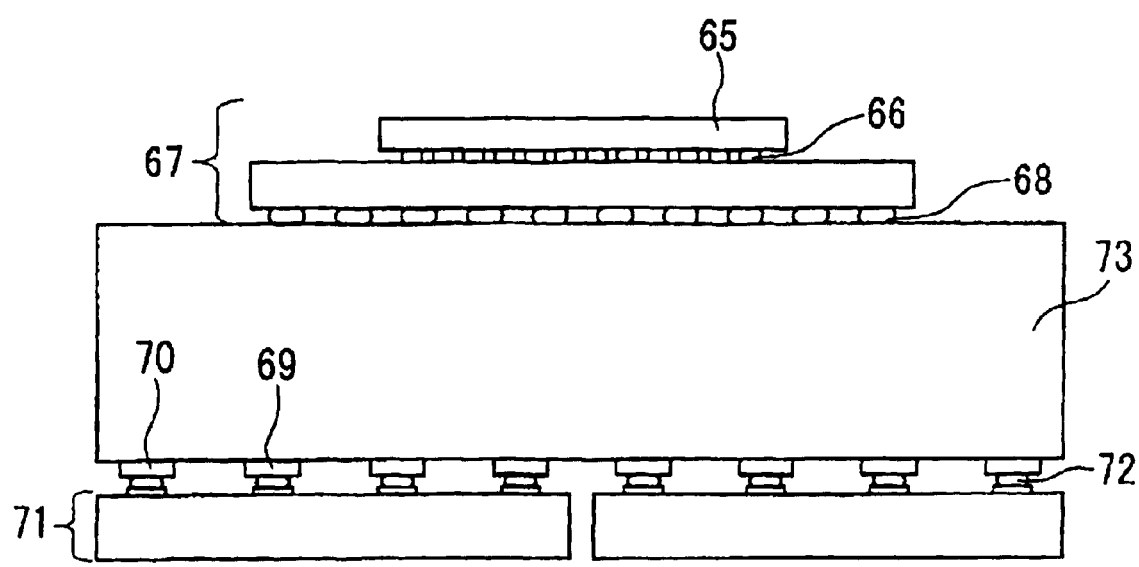
FIG. 12 is a cross sectional elevation view of a semiconductor device over a circuit board with stacked capacitors in a thirteenth embodiment according to the present invention.

A thirteenth embodiment according to the present invention will be described with reference to the drawings. FIG. 12 is a cross sectional elevation view of a semiconductor device over a circuit board with stacked capacitors in a thirteenth embodiment according to the present invention. Stacked capacitors 71 are provided on a bottom of a printed circuit board 73. A CSP 67 is provided on a top surface of the printed circuit board 73 through solder bumps 68. A large scale integrated circuit bare chip 65 is also mounted over the CSP 67 through solder bumps 66. Each of the stacked capacitors 71 is electrically connected to the printed circuit board 73 through solder bumps 72 and terminal electrodes 69 and 70. The terminal electrode 69 is connected to the power line of the large scale integrated circuit. The terminal electrode 70 is connected to the ground line of the large scale integrated circuit. The stacked capacitors 71 are positioned to have a minimum distance from the CSP 67.

It is also possible as a modification that the stacked capacitor 1 having terminal electrodes are provided on the top and bottom surfaces of the circuit board.

EXAMPLE 1

In order to compare a capacity per a unit packaging area between the novel stacked capacitor of the present invention and the conventional stacked capacitor, a capacity of the novel stacked capacitor of the present invention was calculated assuming that the novel stacked capacitor has the same bottom area as the conventional stacked capacitor.

The conventional stacked capacitor was selected which has a rated voltage of 16V and a shape 1005 which is defined by a length of 1.0 mm, a width of 0.5 mm and a thickness of 0.5 mm as well as has a capacity of 0.022 micro-F. This capacity is the maximum commercially available value under the conditions of those shape and the rated voltage.

The packaging area of the single stacked capacitor of the 1005-shape is 1.6 mm×0.8 mm. The stacked capacitor of the present invention comprises a matrix array of eight stacked capacitor units which are commercially available, wherein the matrix array is 4×2 at a land distance of 0.6 mm. The packaging area is defined by a length "L" and a width "W". The length "L" of the packaging area is (0.8×4)+(0.6×3)=5.0 mm. The width "W" of the packaging area is (1.6×2)+0.6=3.8 mm. The packaging area is 5.0×3.8=19.0 mm². The capacity per a unit packaging area of the arrayed eight stacked ceramic capacitors is 22=8 nF/19.0 mm²=9.26 nF/mm².

The capacity of the novel stacked ceramic capacitor will herein be calculated, assuming that the dielectric constant is 3000 which is similar to what is used for the commercially available ceramic capacitor. It is also assumed that the diameter of the via is 0.2 mm and a gap between the via and the internal electrode is 0.1 mm, and the internal electrode is distanced from the four sides of the dielectric layer by 0.2 mm. It is also assumed that the thickness of the dielectric layer as sintered is 12 micrometers. The capacity of the single dielectric layer is calculated in accordance with the equation $C=\epsilon_0 \epsilon S/d$, (S=effective area)

$$C=8.856\times10^{-12}\times3000((5.0-0.2\times2)\times(3.8-0.2\times2)-0.2\times0.2\times\pi\times16)\times10^{-6}/(12\times10^{-6})=30.2\ nF.$$

In order that the thickness of the stacked capacitor of the present invention is 0.5 mm which is the same as the commercially available stacked ceramic capacitor, the maximum number of the laminations of the dielectric layers is 25=(0.5−0.1×2)/0.012, assuming that respective thicknesses of top and bottom passivation layers are 0.1 mm. The stacked capacitor having the same packaging area as the commercially available stacked capacitor has the maximum capacity of 30.2×25=755 nF. The capacity per a unit package area is 755 nF/19.0 mm²=39.7 nF/mm². This capacity is higher by 4.3 times than the eight stacked ceramic capacitor.

The stacked capacitor of the present invention has the capacity per a unit packaging area which is larger than that of the commercially available stacked ceramic capacitor.

EXAMPLE 2

The method of forming the stacked capacitor and the packaging method therefor will be described. Barium titanate based dielectric powders were used. A dielectric constant is 3000, and X7R characteristic is satisfied. The dielectric powers were admixed with a solvent and a binder to form a slurry. This slurry was applied by a doctor blade to form a green sheet over a carrier film. The thickness of the green sheet was 30 micrometers. The green sheet was peeled from the carrier film and cut into a predetermined shape before via holes were formed by a puncher and a via paste was filled into the via holes. The via paste comprises a silver palladium paste. A ratio of silver to palladium was 50/50 in accordance with a sintering temperature. With reference to the position of the via electrodes, a conductive paste was formed by a screen printing method. The conductive paste was platinum paste because the sintering temperature of the dielectric is high, for example, about 1300° C. The via electrode has a peripheral margin of about 0.1 mm from the internal electrode.

The green sheets having the via electrodes and the internal electrodes were laminated to form a predetermined structure for subsequent carrying out a thermal compression bonding. A heat temperature was 90° C. The stacking number of the printed sheets including the internal electrodes was 20. The stacking number of the printed sheets including the via electrodes was 10. The stacking number of the non-printed sheets was 10. The stacked structure as thermal compression-bonded was cut into the predetermined shape and removing binder therefrom, prior to the sintering process in the range of 1250° C.–1350° C. Terminal electrodes were formed aligned to positions of the exposed vias from the bottom surface of the sintered sample.

Figure 13:
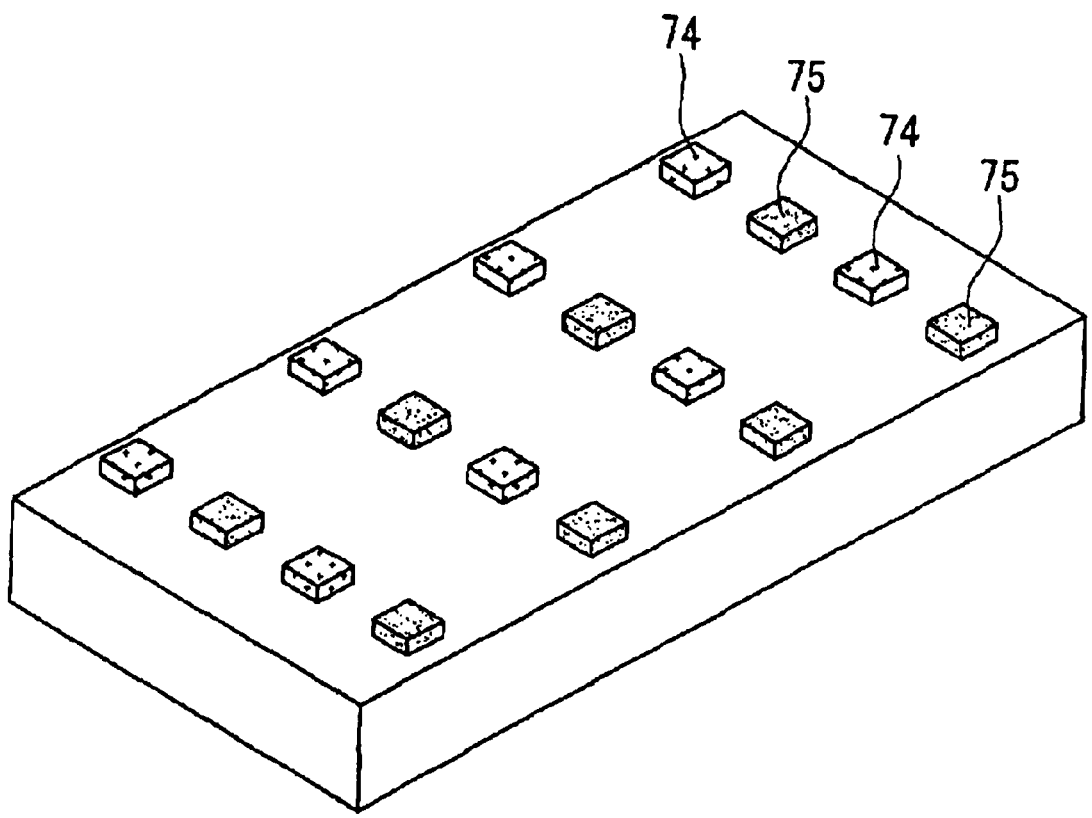
FIG. 13 is a perspective view of a bottom surface of the stacked capacitor as prepared in this example in accordance with the present invention.

The stacked capacitor has a size of L=6.0 mm×W=4.0 mm×t=0.8 mm. The terminal electrodes were formed only on the bottom surface. The array of the terminal electrodes comprise four alignments at 0.8 mm pitch in the length direction, four alignments at 0.6 mm pitch in the width direction. FIG. 13 is a perspective view of a bottom surface of the stacked capacitor as prepared in this example in accordance with the present invention. Terminal electrodes 74 were connected through solders to the power line. Terminal electrodes 75 were connected through solders to the ground line.

Figure 14:
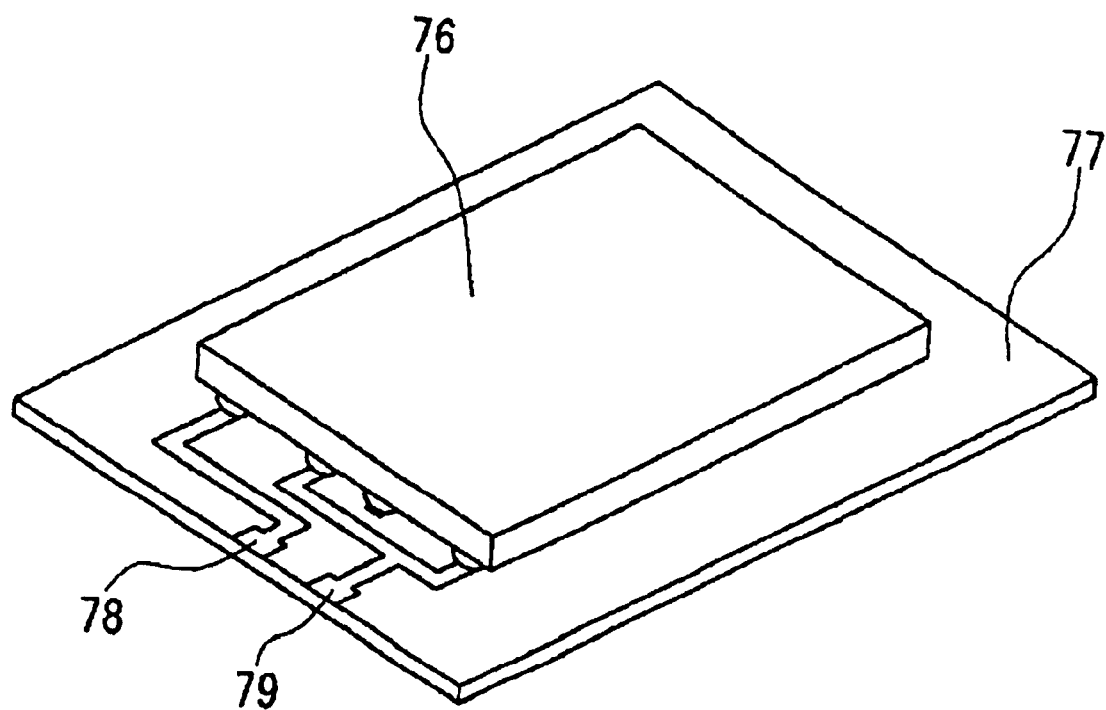
FIG. 14 is a perspective view of a stacked capacitor mounted on the evaluation board in accordance with the present invention.

In order to measure an equivalent inductance of the stacked capacitor as prepared, a stacked capacitor 76 was mounted onto an evaluation board 77 through solders. FIG. 14 is a perspective view of a stacked capacitor mounted on the evaluation board. The evaluation board 77 has terminal pads 78 and 79, onto which a probe is contacted to measure an impedance in the frequency range of 1 MHz to 100 MHz. The used impedance analyzer was HP4291B impedance analyzer. Prior to the impedance measurement, LCR-meter (HP4274) was used to measure a static capacity and a dielectric loss at 1 kHz, 1 Vrms. The static capacity was 0.08 micro-F. The dielectric loss was 0.008.

Figure 15:
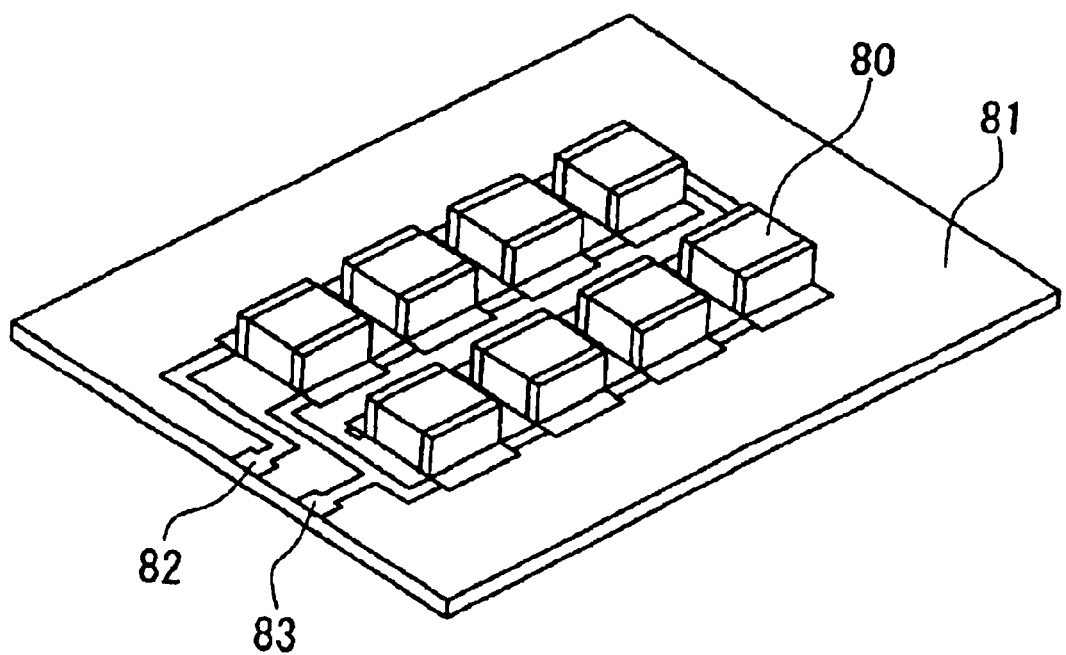
FIG. 15 is a perspective view of the eight conventional stacked capacitors mounted on the evaluation board in accordance with the present invention.

Eight of commercially available stacked ceramic capacitors 80 (X'R-characteristic, L=1.0 mm×W=0.5 mm×t=0.5 mm, 0.01 micro-F) were mounted on an evaluation board which has the same structure as the evaluation board 77. FIG. 15 is a perspective view of the eight conventional stacked capacitors mounted on the evaluation board. The evaluation board 81 has terminal pads 82 and 83, onto which a probe is contacted to measure an impedance in the frequency range of 1 MHz to 100 MHz. The used impedance analyzer was HP4291B impedance analyzer.

Figure 16:
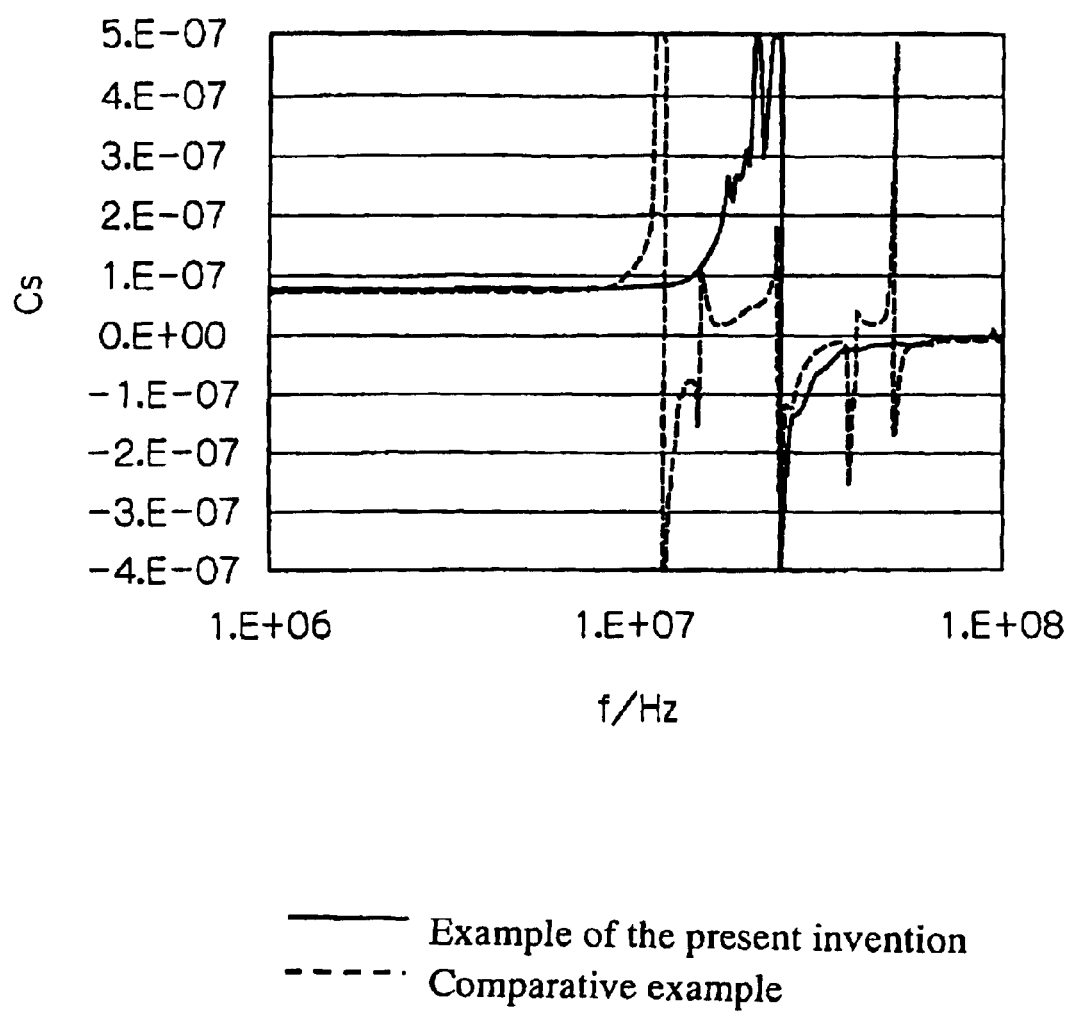
FIG. 16 is a diagram illustrative of variations in equivalent series capacitance (Cs) over frequency in accordance with the present invention.

FIG. 16 is a diagram illustrative of variations in equivalent series capacitance (Cs) over frequency. Real line represents variations in equivalent series capacitance (Cs) over frequency of the staked capacitor of the example of the present invention. Broken line represents variations in equivalent series capacitance (Cs) over frequency of the staked capacitor in the comparative example.

In the frequency range of 1 MHz to 7 MHz, the staked capacitor of the example of the present invention shows almost the same equivalent series capacitance (Cs) as the staked capacitor in the comparative example. Of the example of the present invention, the equivalent series capacitance (Cs) has a peak in the vicinity of 25 MHz. At the frequency just over 25 MHz, the equivalent series capacitance (Cs) rapidly drops into the negative value. This frequency corresponds to the LC-resonant frequency of the combination of the interconnection and the capacitor after the stacked capacitor was mounted on the evaluation board. In cause of the stacked capacitors of the comparative example, the equivalent series capacitance (Cs) has a peak in the vicinity of 12 MHz. At the frequency just over 25 MHz, the equivalent series capacitance (Cs) rapidly drops into the negative value. This frequency corresponds to the LC-resonant frequency of the combination of the interconnection and the capacitor after the stacked capacitor was mounted on the evaluation board. The inductance of the interconnection is uniform between the example of the present invention and the comparative example. The stacked capacitor of the example of the present invention is smaller in inductance than the stacked capacitor of the comparative example. For this reason, the stacked capacitor of the example of the present invention is smaller in the LC-resonant frequency than the stacked capacitor of the comparative example.

The evaluation on performance of compensation to the voltage drop due to the load variation of the large scale integrated circuit was made for the stacked capacitors in the example of the present invention and in the comparative example. The evaluation was made by using the equivalent circuit of FIG. 9A.

Figure 17:
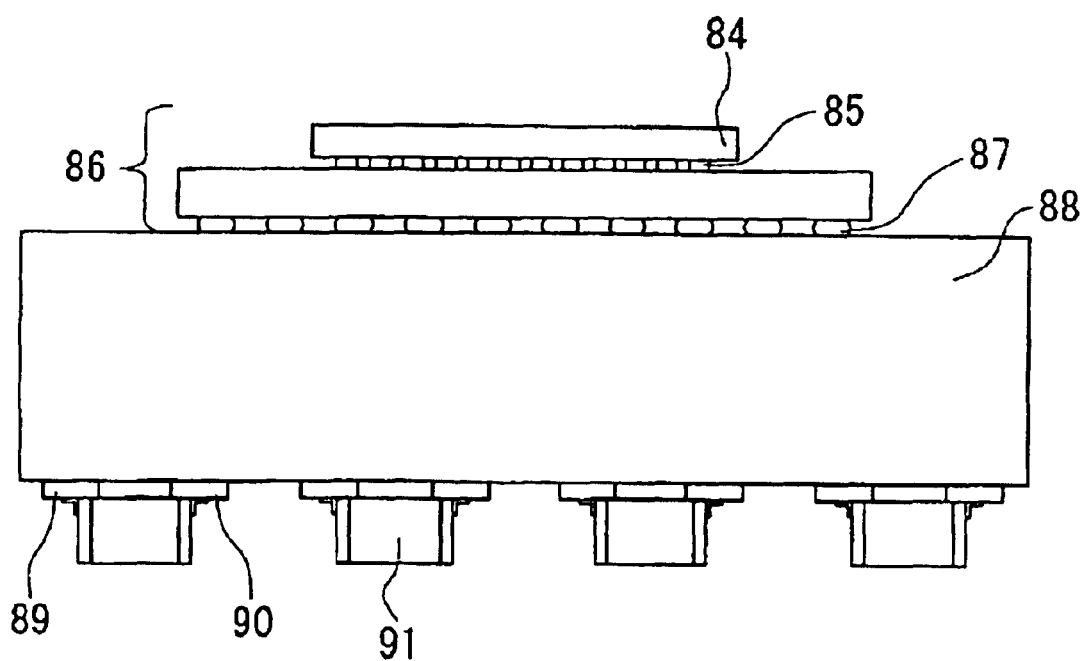
FIG. 17 is a cross sectional elevation view of stacked capacitors on a bottom surface of a printed circuit in accordance with the present invention.

FIG. 17 is a cross sectional elevation view of stacked capacitors on a bottom surface of a printed circuit board in accordance with the present invention. The four stacked capacitors were mounted in a matrix array on the bottom surface of the printed circuit board having a top surface, on which the as shown in FIG. 12. For comparison, a package 86 was mounted on a printed circuit board 88 through solders 87. The same large scale integrated circuit 84 is mounted on the package 86 through solder bumps 85. 32 of the commercially available stacked ceramic capacitors 91 is mounted in a matrix array of 8×4 on a bottom surface of the printed circuit board 88. The commercially available stacked ceramic capacitor 91 has the same structure as the stacked ceramic capacitor 80.

Figure 9B:
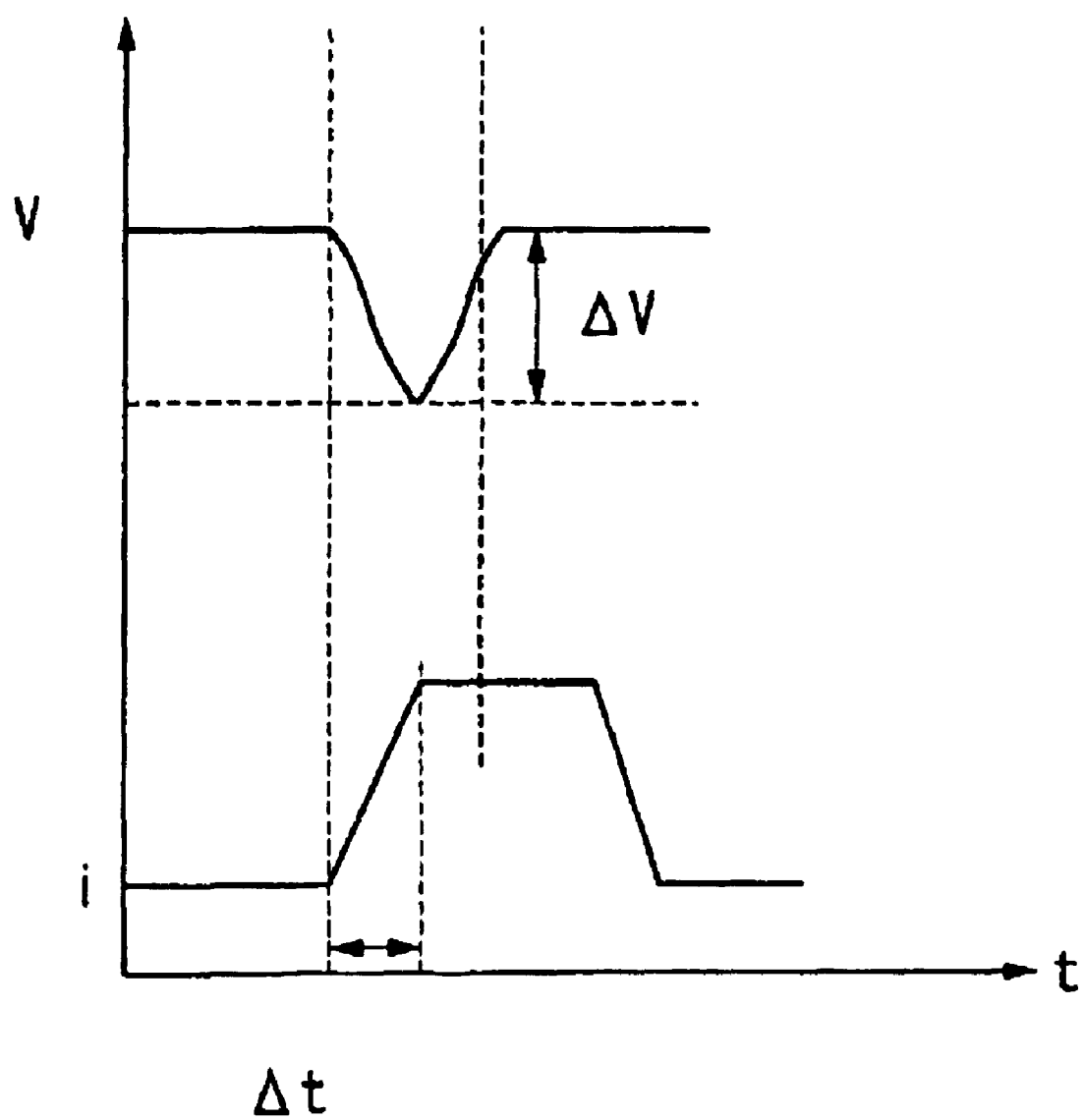
FIG. 9B is a diagram illustrative of the simulation of the voltage drop of the power voltage for the LCR due to a rapid variation of the load.

The voltage drop of the power voltage for the LCR due to a rapid variation of the load was simulated. FIG. 9B is a diagram illustrative of the simulation of the voltage drop of the power voltage for the LCR due to a rapid variation of the load. It was assumed that the power voltage is 3.3 V, and the clock frequency was 500 MHz for the large scale integrated circuit. The rising time was 0.5 nanoseconds.

In the stationary state, a constant current is supplied from the power source, whereby the decoupling capacitor was fully charged. The current was rapidly applied upon the load variation to the stationary state current to the large scale integrated circuit. The extra charges were supplied from the decoupling capacitor for increasing the current. The voltage drop of the large scale integrated circuit was represented by:

$$\Delta V = R \times \Delta i + L \times di/dt \tag{1}$$

where R is the tot al series resistance from the decoupling capacitor to the large scale integrated circuit, and C is the static capacitor. R=R38+R38'+R44. L=L38+L38'+L44.

From the measured results of the dependency of the equivalent series capacitance upon the frequency, the equivalent inductance of the novel stacked capacitor including the length of the interconnection of the evaluation board 77 was calculated by based on the equation (2).

$$f^2 = 1/(4 \times \pi^2 \times L \times C) \tag{2}$$

Since the resonant frequency f=20 MHz, L=800 pH.

The equivalent inductance of the novel stacked capacitor including the length of the interconnection of the evaluation board 77 was calculated by based on the equation (2). Since the resonant frequency f=10 MHz, L=3.2 nH. It was assumed that 4 of the novel stacked capacitors of the present invention were mounted, whilst 32 of the conventional stacked capacitors of the present invention were mounted. The equivalent inductance of the decoupling capacitor in the example of the present invention was 800 pH/4=200 pH. The equivalent inductance of the decoupling capacitor in the comparative example of the present invention was 3.2 nH/4=800 pH. The equivalent inductance corresponds to the inductance L46 of FIG. 9. C45=0.08 nF. R44=0.1 ohms. The inductances of the through holes of the printed circuit board correspond to L39 and L39', each of which is 0.5 nH.

It was assumed that the current Δi=0.3A generated from the large scale integrated circuit synchronizing with the clock frequency of 500 MHz. In the rising time period of the pulse, the current i(t) is represented by the following equation (5):

$$i(t)=0.6\times 10^9 \times t (0 \leq t \leq 0.5 \text{ ns}) \qquad (5)$$

From the above equations (1) and (5), the voltage drops ΔV in the example of the present invention and in the comparative example were as follows, provided that t=0.5 ns for the maximum voltage drop upon the rising of the pulse.

(example) $\Delta V = R \times 0.6 \times 10^9 \times t + L \times 0.6 \times 10^9 \approx 0.03 + 0.72 \approx 0.75$ (comparative example) $\Delta V = R \times 0.6 \times 10^9 \times t + L \times 0.6 \times 10^9 \approx 0.03 + 1.48 \approx 1.51$ The present invention is effective to reduce the voltage variation upon the rapid load variation of the large scale integrated circuit.

EXAMPLE 3

The method of forming the stacked capacitor and the packaging method therefor will be described. Barium titanate based dielectric powders were used. A dielectric constant is 3000, and X7R characteristic is satisfied. The dielectric powers were admixed with a solvent and a binder to form a slurry. This slurry was applied by a doctor blade to form a green sheet over a carrier film. The thickness of the green sheet was 30 micrometers. The green sheet was peeled from the carrier film and cut into a predetermined shape before via holes were formed by a puncher and a via paste was filled into the via holes. The via paste comprises a silver palladium paste. A ratio of silver to palladium was 50/50 in accordance with a sintering temperature. The via paste was further added with 2.0 wt % of aluminum oxide powers for forming a low dielectric layer around the via. With reference to the position of the via electrodes, a conductive paste was formed by a screen printing method. The conductive paste was platinum paste because the sintering temperature of the dielectric is high, for example, about 1300° C.

The green sheets having the via electrodes and the internal electrodes were laminated to form a predetermined structure for subsequent carrying out a thermal compression bonding. A heat temperature was 90° C. The stacking number of the printed sheets including the internal electrodes was 25. The stacking number of the printed sheets including the via electrodes as stacked over the internal electrode sheets was 10. The stacking number of the printed sheets including the via electrodes as stacked under the internal electrode sheets was 10. The stacked structure as thermal compression-bonded was cut into the predetermined shape and removing binder therefrom, prior to the sintering process in the range of 1250° C.–1350° C. Terminal electrodes were formed aligned to positions of the exposed vias from the bottom surface of the sintered sample.

Figure 18:
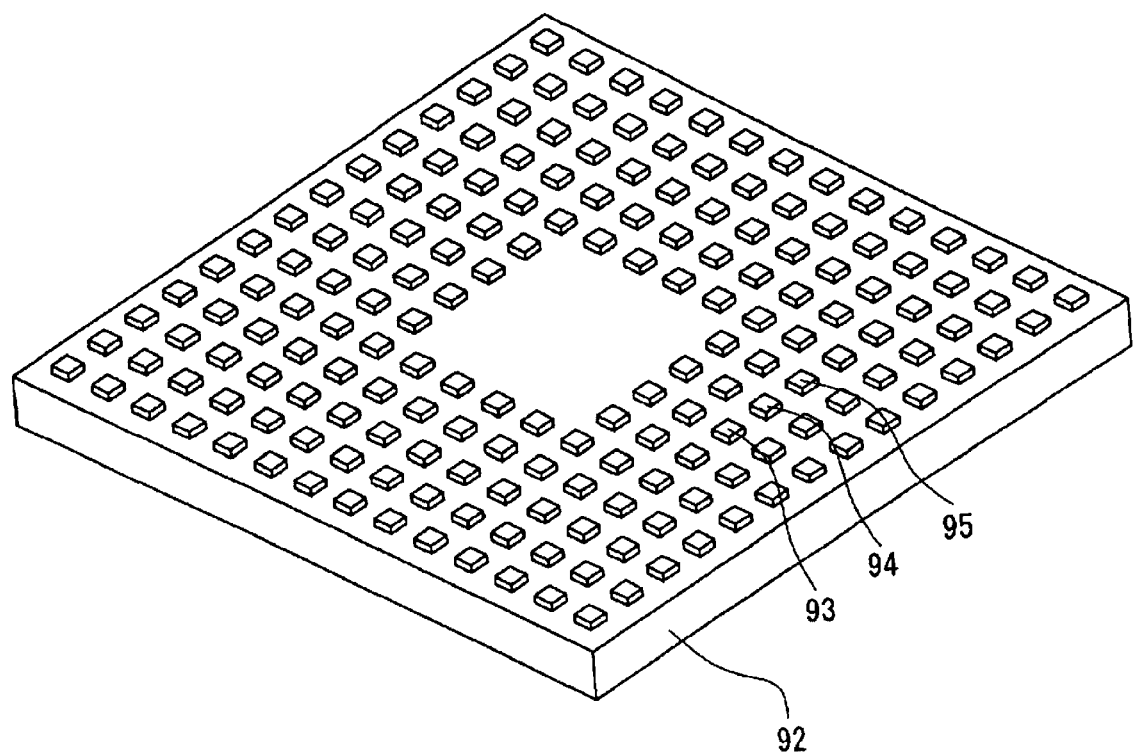
FIG. 18 is a perspective view of a top surface of the stacked capacitor as prepared in this example in accordance with the present invention.

The stacked capacitor has a size of L=12.0 mm×W=12.0 mm×t=0.8 mm. The terminal electrodes were formed on both the top and bottom surfaces. The array of the terminal electrodes comprises fourteen alignments at 0.8 mm pitch in the length direction, fourteen alignments at 0.8 mm pitch in the width direction (14×14), wherein a 4×4 center area has no terminal electrode. FIG. 18 is a perspective view of a top surface of the stacked capacitor as prepared in this example in accordance with the present invention. Terminal electrodes 93, 94 and 95 are aligned in 14×14 matrix over a stacked capacitor 92. Terminal electrodes 93 were connected through solders to the power line. Terminal electrodes 94 were connected through solders to the ground line. Terminal electrodes 95 were connected through solders to the signal line. The bottom surface of the stacked capacitor is electrically connected to the printed circuit board. The top surface of the stacked capacitor is electrically connected to the CSP.

In order to measure an equivalent inductance of the stacked capacitor as prepared, the stacked capacitor 92 was mounted onto an evaluation board. The evaluation board has terminal pads, onto which a probe is contacted to measure an impedance. The static capacity was 1.0 micro-F at 1 kHz. If the stacked capacitor was used as the interposer between the printed circuit board and the CSP package, the signal transmission delay through the dielectric of the high dielectric constant is the important issue. In order to measure the signal delay, pulse signals generated by the pulse generator are applied to the terminals which are to be electrically connected to the signal lines of the large scale integrated circuit, so that input side waveform and output side waveform were observed by an oscilloscope. If the signal passes through the dielectric layer having a thickness of 0.8 mm and having a dielectric constant of 1000, then the signal delay of the novel stacked capacitor was about 50 ps, even the simulated signal delay was about 80 ps. This signal delay reduction means that the low dielectric layer is provided around the via.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A stacked capacitor comprising:
   a dielectric layer;
   a two-dimensional array of terminal electrodes on at least one of first and second surfaces of said dielectric layer;
   first internal electrodes stacked in multi-levels in said dielectric layer, and said first internal electrodes being electrically connected to a power line;
   second internal electrodes stacked in multi-levels in said dielectric layer, and said second internal electrodes being electrically connected to a ground line; and
   vias in said dielectric layer, thereby allowing said terminal electrodes to be electrically connected through said vias to said first and second internal electrodes,
   wherein said two-dimensional array further comprises at least one signal line terminal electrode such that a signal line via connected to said at least one terminal electrode is electrically isolated from said first and second internal electrodes, each said signal line via being surrounded by a low dielectric layer in said dielectric layer, thereby allowing each signal line via to be separated from said dielectric layer, and
   wherein all of said first and second internal electrodes are spatially isolated from said low dielectric layers in said dielectric layer.

2. The stacked capacitor as claimed in claim 1, wherein said two-dimensional array of terminal electrodes are provided on both said first and second surfaces of said dielectric layer.

3. The stacked capacitor as claimed in claim 1, wherein said two-dimensional array of terminal electrodes comprises alternating alignments of said terminal electrodes connected to said power line and said terminal electrodes connected to said ground line.

4. The stacked capacitor as claimed in claim 1, wherein each of said low dielectric layers has a lower dielectric constant than said dielectric layer.

5. The stacked capacitor as claimed in claim 4, wherein said dielectric constant of said low dielectric layer is at least 40.

6. The stacked capacitor as claimed in claim 1, wherein said signal line via comprises a metal containing a glass material.

7. The stacked capacitor as claimed in claim 1, wherein said signal line via comprises a metal containing a metal oxide material.

8. The stacked capacitor as claimed in claim 1, wherein said dielectric layer comprises a perovskite-structured compound.

9. A semiconductor device comprising:
a printed circuit board;
a semiconductor integrated circuit; and
a stacked capacitor which further comprises:
  a dielectric layer;
  a two-dimensional array of terminal electrodes on at least one of first and second surfaces of said dielectric layer;
  first internal electrodes stacked in multi-levels in said dielectric layer, and said first internal electrodes being electrically connected to a power line;
  second internal electrodes stacked in multi-levels in said dielectric layer, and said second internal electrodes being electrically connected to a ground line; and
  vias in said dielectric layer, thereby allowing said terminal electrodes to be electrically connected through said vias to said first and second internal electrodes,
wherein said two-dimensional array further comprises at least one signal line terminal electrode such that a signal line via connected to said at least one terminal electrode is electrically isolated from said first and second internal electrodes, each said signal line via being surrounded by a low dielectric layer in said dielectric layer, thereby allowing each signal line via to be separated from said dielectric layer, and
wherein all of said first and second internal electrodes are spatially isolated from said low dielectric layers in said dielectric layer.

10. The semiconductor device as claimed in claim 9, wherein said stacked capacitor is interposed between said printed circuit board and said semiconductor integrated circuit.

11. The semiconductor device as claimed in claim 9, wherein said stacked capacitor is provided on a first surface of said printed circuit board and a second surface of said printed circuit board.

12. The semiconductor device as claimed in claim 9, wherein said two-dimensional array of terminal electrodes are provided on both said first and second surfaces of said dielectric layer.

13. The semiconductor device as claimed in claim 9, wherein said two-dimensional array of terminal electrodes comprises alternating alignments of said terminal electrodes connected to said power line and said terminal electrodes connected to said ground line.

14. The semiconductor device as claimed in claim 9, wherein each of said low dielectric layers has a lower dielectric constant than said dielectric layer.

15. The semiconductor device as claimed in claim 14, wherein said dielectric constant of said low dielectric layer is at least 40.

16. The semiconductor device as claimed in claim 9, wherein said signal line via comprises a metal containing a glass material.

17. The semiconductor device as claimed in claim 9, wherein said signal line via comprises a metal containing a metal oxide material.

18. The semiconductor device as claimed in claim 9, wherein said dielectric layer comprises a perovskite-structured compound.

* * * * *

UNITED STATES PATENT AND TRADEMARK OFFICE
CERTIFICATE OF CORRECTION

PATENT NO. : 6,794,729 B2
DATED : September 21, 2004
INVENTOR(S) : Toru Mori et al.

It is certified that error appears in the above-identified patent and that said Letters Patent is hereby corrected as shown below:

<u>Title page,</u>
Item [75], Inventors, should read:
-- Toru Mori, Tokyo (JP); Takao Yamazaki, Tokyo (JP); Koichiro Nakase, Tokyo (JP) --

Signed and Sealed this

Fourteenth Day of December, 2004

JON W. DUDAS
*Director of the United States Patent and Trademark Office*